(12) United States Patent
Kwon et al.

(10) Patent No.: US 8,716,872 B2
(45) Date of Patent: *May 6, 2014

(54) STACKED SEMICONDUCTOR PACKAGE INCLUDING CONNECTIONS ELECTRICALLY CONNECTING FIRST AND SECOND SEMICONDUCTOR PACKAGES

(71) Applicant: Samsung Electronics Co., Ltd., Suwon-si (KR)

(72) Inventors: Heung-kyu Kwon, Seongnam-si (KR); Su-chang Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/970,071

(22) Filed: Aug. 19, 2013

(65) Prior Publication Data

US 2013/0334708 A1    Dec. 19, 2013

Related U.S. Application Data

(63) Continuation of application No. 13/240,515, filed on Sep. 22, 2011, now Pat. No. 8,546,954.

(30) Foreign Application Priority Data

Oct. 14, 2010    (KR) .................... 10-2010-0100327

(51) Int. Cl.
*H01L 25/00*    (2006.01)
*H01L 23/498*    (2006.01)

(52) U.S. Cl.
USPC ............ 257/777; 257/E25.001; 257/E23.069; 257/686; 257/723; 257/734; 257/737; 257/738; 257/778

(58) Field of Classification Search
USPC ......... 257/777, 686, 723, 734, 737, 738, 778, 257/E23.069, E25.001
See application file for complete search history.

(56) References Cited

U.S. PATENT DOCUMENTS

| | | | |
|---|---|---|---|
| 7,091,619 B2 | 8/2006 | Aoyagi | |
| 7,507,655 B2 | 3/2009 | Sakaguchi et al. | |
| 7,759,799 B2 | 7/2010 | Ejima | |
| 7,793,413 B2 | 9/2010 | Sakai et al. | |
| 8,288,873 B2 | 10/2012 | Kang et al. | |
| 8,299,596 B2 | 10/2012 | Huang et al. | |
| 8,546,954 B2 * | 10/2013 | Kwon et al. | 257/777 |
| 2001/0004135 A1 | 6/2001 | Okamura | |
| 2002/0158324 A1 | 10/2002 | Hamaguchi et al. | |
| 2003/0114024 A1 | 6/2003 | Miyagawa | |
| 2004/0222510 A1 | 11/2004 | Aoyagi | |
| 2007/0152350 A1 | 7/2007 | Kim et al. | |
| 2007/0254406 A1 | 11/2007 | Lee | |

(Continued)

*Primary Examiner* — Alexander Oscar Williams
(74) *Attorney, Agent, or Firm* — Volentine & Whitt, PLLC

(57) ABSTRACT

A stacked semiconductor package has a first semiconductor package including a first package substrate and a first semiconductor chip mounted on the first package substrate, a second semiconductor package including a second package substrate and a second semiconductor chip mounted on the second package substrate, and a plurality of connections electrically connecting the first and second semiconductor packages. The connections are disposed on an outer region of the first package substrate outside the first semiconductor chip. The connections are disposed along opposite first longer sides and opposite shorter second sides of the first package substrate. The heights of those connections disposed along each longer first side gradually vary from a central to an outer region (i.e., the ends) of the longer first side.

19 Claims, 26 Drawing Sheets

(56) References Cited

U.S. PATENT DOCUMENTS

| | | |
|---|---|---|
| 2008/0088001 A1 | 4/2008 | Kim et al. |
| 2008/0258317 A1 | 10/2008 | Ejima |
| 2008/0283994 A1 | 11/2008 | Tsai et al. |
| 2008/0303173 A1 | 12/2008 | Hamada et al. |
| 2010/0078788 A1 | 4/2010 | Wagiman et al. |
| 2010/0136745 A1 | 6/2010 | Hwang |
| 2010/0148350 A1 | 6/2010 | Shinohara et al. |
| 2010/0171205 A1 | 7/2010 | Chen et al. |
| 2010/0171207 A1 | 7/2010 | Shen et al. |
| 2010/0181686 A1 | 7/2010 | Sugino et al. |
| 2010/0200975 A1 | 8/2010 | Chino |
| 2010/0237488 A1 | 9/2010 | Kwon et al. |
| 2010/0321908 A1 | 12/2010 | Shiota |
| 2011/0084405 A1 | 4/2011 | Suzuki et al. |
| 2011/0117700 A1 | 5/2011 | Weng et al. |
| 2011/0210436 A1 | 9/2011 | Chow et al. |
| 2011/0233771 A1 | 9/2011 | Kwon et al. |
| 2012/0013007 A1 | 1/2012 | Hwang et al. |
| 2012/0020040 A1 | 1/2012 | Lin et al. |
| 2012/0068319 A1 | 3/2012 | Choi et al. |
| 2012/0146241 A1 | 6/2012 | Huang et al. |
| 2012/0167466 A1 | 7/2012 | Abughazaleh |
| 2012/0193789 A1 | 8/2012 | Hu et al. |
| 2012/0241950 A1 | 9/2012 | Takahashi |
| 2012/0262820 A1 | 10/2012 | Matsumoto et al. |
| 2012/0267782 A1 | 10/2012 | Chen |

* cited by examiner

STACKED SEMICONDUCTOR PACKAGE INCLUDING CONNECTIONS ELECTRICALLY CONNECTING FIRST AND SECOND SEMICONDUCTOR PACKAGES

PRIORITY STATEMENT

This is a Continuation of U.S. Non-Provisional patent application No. 13/240,515, filed Sep. 22, 2011, and now U.S. Pat. No. 8,546,954, issued Oct. 1, 2013, which claims the benefit of Korean Patent Application No. 10-2010-0100327, filed on Oct. 14, 2010, in the Korean Intellectual Property Office, the disclosure of which is incorporated herein in its entirety by reference.

BACKGROUND

The inventive concept relates to semiconductor devices. More particularly, the inventive concept relates to stacked types of semiconductor packages and to methods of manufacturing stacked types of semiconductor package.

The smaller and more compact and more functional many of today's electronic devices are, the more popular they tend to be. Thus, there is a growing demand for smaller, thinner, and lighter semiconductor packages and for semiconductor chips that have higher capacities, such as data storage capacities, within a given amount of space. However, there are limitations as to how much capacity a semiconductor chip may have within a certain amount of space. Accordingly, stacked semiconductor packages comprising stacked semiconductor chips or stacked semiconductor chip packages (e.g., package on package or POPs) are being actively developed.

SUMMARY

According to an aspect of the inventive concept, there is provided a stacked semiconductor package comprising a first semiconductor package, a second semiconductor package, and a plurality of connections electrically connecting the first semiconductor package and the second semiconductor package and at least some of which have different heights. The first semiconductor package includes a first package substrate and a first semiconductor chip mounted on the first package substrate. The first package substrate has lateral first and second sides constituting the outer peripheral region thereof and of which the first side is longer than the second side. The second semiconductor package includes a second package substrate and a second semiconductor chip mounted on the second package substrate. The connections are disposed outside the first semiconductor chip along an outer peripheral region of the first package substrate which includes the first and second sides. A first group of the connections is disposed along the longer first side of the first package substrate as spaced from one another along the longer first side, and the heights of these connections vary from a central to an outer region of the longer first side.

According to another aspect of the inventive concept, there is provided a semiconductor device comprising a mother board, a plurality of external contact electrodes disposed on the mother board, a first semiconductor package, a second semiconductor package, and connections electrically connecting the first and second semiconductor packages and at least some of which have different heights. The first semiconductor package includes a first package substrate and a first semiconductor chip mounted on the first package substrate. The first package substrate has lateral first and second sides constituting the outer peripheral region thereof and of which the first side is longer than the second side. The second semiconductor package includes a second package substrate and a second semiconductor chip mounted on the second package substrate. The connections are disposed outside the first semiconductor chip along an outer peripheral region of the first package substrate which includes the first and second sides. A first group of the connections is disposed along the longer first side of the first package substrate as spaced from one another along the longer first side, and the heights of these connections vary from a central to an outer region of the longer first side.

According to another aspect of the present invention, there is provided a method of fabricating a stacked semiconductor package, the method including: providing a first semiconductor package including a first package substrate and a first semiconductor chip mounted on the first package substrate; providing a second semiconductor package including a second package substrate and a second semiconductor chip mounted on the second package substrate; forming a plurality of connection portions between an outer region of a top surface of the first package substrate outside the semiconductor chip and a region of the second package substrate corresponding to the outer region, wherein from among the connection portions, heights of connection portions disposed along a longer side of the first package substrate are gradually changed from a center to an outer region of the longer side; and heat treating the connection portions to stack the second semiconductor package on the first semiconductor package.

A method of fabricating a stacked semiconductor package, the method comprising: providing a first semiconductor package including a first package substrate and a first semiconductor chip mounted on the first package substrate, providing a second semiconductor package including a second package substrate and a second semiconductor chip mounted on the second package substrate, forming a stack in which the first and second semiconductor packages are juxtaposed with a top surface of the first package substrate facing a bottom surface of the second package substrate, and providing a plurality of connections at least some of which have different heights between an outer region of the top surface of the first package substrate outside the first semiconductor chip and a region of the bottom surface of the second package substrate aligned with the outer region in the stack, and subsequently heat treating the connections to fix the second semiconductor package to the first semiconductor package. Specifically, a first group of the connections are provided along the longer first side of the first package substrate as spaced from one another along the longer first side, and connections of the first group are formed of different heights varying from a central to an outer region of the longer first side of the first package substrate.

BRIEF DESCRIPTION OF THE DRAWINGS

The inventive concept will be more clearly understood from the following detailed description of the preferred embodiments thereof taken in conjunction with the accompanying drawings in which.

DETAILED DESCRIPTION OF THE PREFERRED EMBODIMENTS

Figure 1:
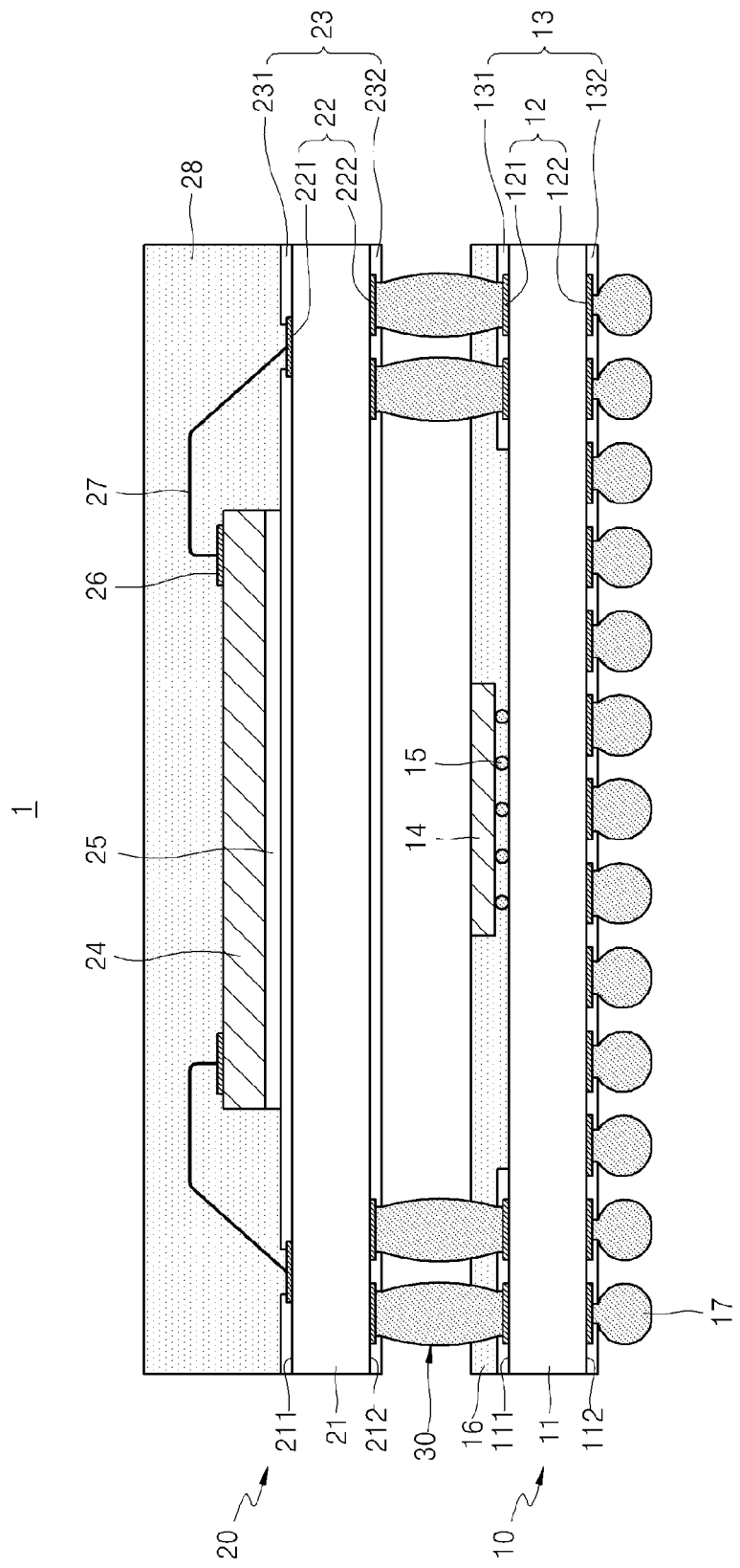
FIG. 1 is a schematic cross-sectional view of a generic of idealized form of a stacked semiconductor package to which the inventive concept is applied.

Various embodiments and examples of embodiments of the inventive concept will be described more fully hereinafter with reference to the accompanying drawings. In the drawings, the sizes and relative sizes and shapes of elements, layers and regions shown in section may be exaggerated for clarity. In particular, the cross-sectional illustrations of the semiconductor devices and intermediate structures fabricated during the course of their manufacture are schematic and thus the same element present in different sectional views may not always be depicted consistently. Also, like numerals are used to designate like elements throughout the drawings, including through the use of superscripts.

It will also be understood that when an element or layer is referred to as being "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. The term metal interconnection portion, for example, as used herein may indicate a patterned metal layer made up of conductive traces, leads, lands, and/or pads, as would be understood by those in the art.

Furthermore, spatially relative terms, such as "upper," and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use. In addition, the terms "top" or "bottom" as used to describe a surface may not refer to the orientation depicted in the drawings but may refer to its disposition relative to another element or layer, as would be clear from the drawings and context of the written description. For example, a "top" surface of an electrode pad disposed on a substrate may refer to the surface of the electrode pad that faces away from the substrate even though the "top" surface is facing downwardly in the orientation shown in the drawing and is hence the lowermost surface in the orientation depicted.

A first embodiment of stacked semiconductor package 1 according to the inventive concept will now be described in detail with reference to FIG. 1.

The stacked semiconductor package 1 includes a lower semiconductor package 10, an upper semiconductor package 20, and a plurality of connections 30. The upper semiconductor package 20 is stacked on the lower semiconductor package 10 through the connections 30. Note, for the sake of convenience, FIG. 1 shows idealized shapes of the lower semiconductor package 10 and the upper semiconductor package 20 as a result of the inventive concept, e.g., without any warpage in the lower semiconductor package 10 and the upper semiconductor package 20.

The lower semiconductor package 10, as an example, comprises a lower package substrate 11, a metal interconnection portion 12, a protective portion 13, a first semiconductor chip 14, conductive bumps 15, a molding member 16, and external contact electrodes 17.

The lower package substrate 11 may have the form of a rectangular plate of a given thickness so as to have a top surface 111 and a bottom surface 112, and is of insulating material. In this latter respect, the lower package substrate 11 may be of a conventional stiff resin, a photosensitive liquid dielectric, a photosensitive dry-film dielectric, a dry (thermally cured) flexible polyimide film, a thermally cured liquid dielectric, a resin-coated copper foil (RCC), a thermoplastic, or a flexible resin. Alternatively, the lower package substrate 11 may be ceramic. However, these materials are just examples.

The metal interconnection portion 12 includes first electrode pads 121 on the top surface 111 of the lower package substrate 11 and second electrode pads 122 on the bottom surface 112 of the lower package substrate 11. Although not illustrated, the first electrode pads 121 are electrically connected to the second electrode pads 122 through vias extending in/through the lower package substrate 11. Furthermore, at least one inner interconnection layer may be disposed within the lower package substrate 11 and connected to the vias to route the signals from the first electrode pads 121 to the second electrode pads 122 and vice versa.

The metal interconnection portion 12, i.e., the electrode pads 121 and 122, may be formed of aluminum or copper. In addition, the major exposed surfaces of the metal interconnection portion 12 may be plated with tin (Sb), gold (Au), nickel (Ni), or lead (Pb). The metal interconnection portion 12 can be formed, as is well known in the art per se, by forming a metal layer on the top surface 111 (and bottom surface 112) of the lower package substrate 11 by casting, laminating, or electroplating, and then patterning the metal layer by etching the metal layer.

The protective portion 13 may include a first protection layer 131 covering the top surface 111 of the lower package substrate 11 and a second protection layer 132 covering the bottom surface 112 of the lower package substrate 11. Each layer of the protective portion 13 may be formed of insulating material. For example, each layer of the protective portion 13 may be of a solder photoresist that can be patterned by photolithography.

The first protection layer 131 exposes only a central region of the upper surface of each of the first electrode pads 121. Similarly, the second protection layer 132 exposes only a central region of the upper surface of each of the second electrode pads 122. The structure constituted by the substrate 11, electrode pads 121 and 122, and protection layers 131 and 132 is referred to as a solder mask defined (SMD) interconnection line substrate. The stacked semiconductor packages illustrated in FIGS. 9 through 12 include such SMD-type interconnection line substrates.

However, the protection layers of the protective portion 13 may expose the upper surfaces of each of the first electrode pads 121 and the second electrode pads 122 in their entirety. The structure so constituted is referred to as a non-solder mask defined (NSMD) interconnection line substrate. The stacked semiconductor package illustrated in FIGS. 13 through 16 include NSMD interconnection line substrates.

Referring again to FIG. 1, the first semiconductor chip 14 comprises, for example, a photoelectron device, a logic device, a communication device, a digital signal processor, or a system-on-chip. In the illustrated example, the first semiconductor chip 14 is mounted on a central region of the top surface 111 of the lower package substrate 11. However, the first semiconductor chip 14 may instead be mounted on the bottom surface 112 of the lower package substrate 11.

Also, in the illustrated example, the first semiconductor chip 14 is mounted on the first package substrate 11 using a flip-chip method. However, the first semiconductor chip 14 may instead be mounted on the first package substrate 11 by wire bonding. As another alternative, the first semiconductor chip 14 may be embedded in the lower package substrate 11, and in this case, the thickness of the lower semiconductor package 10 is minimized.

Also, in the illustrated example, the lower semiconductor package 10 has only one semiconductor chip. However, the lower semiconductor package 10 may have two or more semiconductor chips stacked on each other. In this case, one semiconductor chip may be a logic device and another semiconductor chip may be a central processing unit (CPU) device, for example.

The conductive bumps 15 are interposed between the top surface 111 of the lower package substrate 11 and the first semiconductor chip 14, and electrically connect the lower package substrate 11 to the first semiconductor chip 14. More specifically, contact pads (not shown) formed on the first semiconductor chip 14 are disposed facing the top surface 111 of the lower package substrate 11, and the contact pads of the first semiconductor chip 14 are respectively electrically connected via the conductive bumps 15 to bonding fingers or bonding pads (not shown) formed on the top surface 111 of the lower package substrate 11.

The molding member 16 may be formed of an insulating resin, for example, an epoxy molding compound (EMC), on the top surface 111 of the lower package substrate 11 so as to protect the conductive bumps 15 and the connections 30. More specifically, the molding member 16 fills the space between the first semiconductor chip 14 and the top surface 111 of the lower package substrate 11 so as to protect electrical contacts between the first semiconductor chip 14 and the conductive bumps 15. Also, the molding member 16 may cover side surfaces of the first semiconductor chip 14 and side surfaces of the connections 30.

In the present embodiment, the molding member 16 does not extend over the upper surface of the first semiconductor chip 14. That is, the upper surface of the first semiconductor chip 14 is exposed. Accordingly, the stacked semiconductor package 1 may possess excellent structural, electrical, and physical characteristics. For instance, the stacked semiconductor package 1 can have excellent heat dissipating characteristics, and may be relatively thin. Therefore, the stacked semiconductor package 1 is resistant to warping or distorting and as a result, the lower package substrate 11 and the first semiconductor chip 14 remain very flat. In addition, physical pressure may be directly applied to the first semiconductor chip 14, i.e., without being applied via the molding member 16. Therefore, the present embodiment facilitates the use of a grid array technique or a multi-layered molding technique.

The external contact electrodes 17 may be solder balls, solder bumps, or solder paste, and may be arrayed in a grid such that the lower semiconductor package has the form of a ball grid array (BGA) package. In any case, the external contact electrodes 17 are respectively formed on the second electrode pads 122 and are the means by which the lower semiconductor package 10 can be mounted or disposed on a mother substrate or another semiconductor package. In this regard, a high-temperature heat treatment process, such as a wave soldering process or a reflow soldering process, may be performed to bond the second electrode pads 122 to a mother board or another semiconductor package via the external contact electrodes 17.

The example of the upper semiconductor package 20 of this embodiment has an upper package substrate 21, a metal interconnection portion 22, a protective portion 23, a second semiconductor chip 24, an adhesive layer 25, bonding pads 26, bonding wires 27, and a molding member 28. The structure of the upper semiconductor package 20 is similar to the structure of the lower semiconductor package 10 in this respect and thus reference may be had to the previous description but some portions/constituent elements of the upper semiconductor package 20 will also be described in more detail below.

The upper package substrate 21 may be a rectangular plate of insulating material so as to have a top surface 211 and a lower surface 212.

The metal interconnection portion 22 includes first electrode pads 221 formed on the top surface 211 of the upper package substrate 21 and second electrode pads 222 formed on the bottom surface 212 of the upper package substrate 21. Although not illustrated, the first electrode pads 221 may be electrically connected to the second electrode pads 222 through vias passing through the upper package substrate 21. In addition, at least one inner interconnection layer, electrically connecting the first electrode pads 221 to the second electrode pads 222, may be disposed in the upper package substrate.

The protective portion 23 is formed of insulating material for protecting the metal interconnection portion 22, and in this example includes a first protection layer 231 covering the top surface 211 of the upper package substrate 21 and a second protection layer 232 covering the bottom surface 212 of the upper package substrate 21. Also, in the present embodiment, the first protection layer 231 exposes central regions only of the upper surfaces of each of the first electrode pads 221, and the second protection layer 232 exposes central regions only of each of the second electrode pads 222. However, the protective portion 23 may expose the upper surfaces of each of the first electrode pads 221 and the second electrode pads 222 in their entirety.

The second semiconductor chip 24 may be a volatile memory device, such as a dynamic random access memory (DRAM) or a static random access memory (SRAM), or a non-volatile memory device, such as a flash memory. Furthermore, in the illustrated example, the upper semiconductor package 20 has only one first semiconductor chip. However, the upper semiconductor package 20 may include two or more semiconductor chips stacked on each other.

Also, in the illustrated example, the second semiconductor chip 24 is mounted on a central region of the top surface 211 of the upper package substrate 21 and fixed thereto by the adhesive layer 25. However, the second semiconductor chip 24 may instead be mounted on the bottom surface 212 of the upper package substrate 21.

Furthermore, in the illustrated example, the second semiconductor chip 24 is mounted on the upper package substrate 21 by wire bonding. More specifically, the bonding pads 26 are formed on a top surface of the second semiconductor chip 24, and the bonding pads 26 are respectively electrically connected to the first electrode pads 221 through the bonding wires 27. However, the second semiconductor chip 24 may instead be mounted on the upper package substrate 21 by flip-chip bonding. As another alternative, the first semiconductor chip 24 may be embedded in the upper package substrate 21 in which case, the thickness of the upper semiconductor package 20 may be minimized.

The molding member 28 is formed on the upper surface 211 of the upper package substrate 21 so as to protect the second semiconductor chip 24, the adhesive layer 25, the bonding pads 26, and the bonding wires 27. To this end, the molding member 28 may be of an insulating resin, for example, an EMC.

Figure 2:
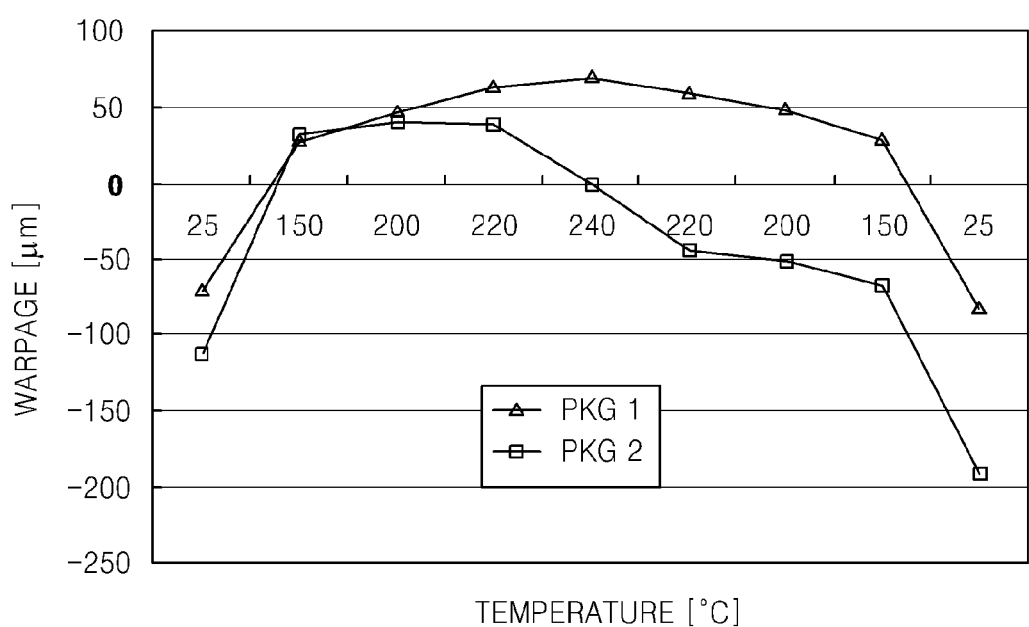
FIG. 2 is a graph of warpage of a reference surface according to the temperatures of a lower semiconductor package and an upper semiconductor package when a reflow soldering process is performed during the fabricating of the stacked semiconductor package of FIG. 1.

FIG. 2 is a graph of the warpage with respect to a reference surface exhibited by a stacked semiconductor package corresponding to that of FIG. 1 (but without the inventive concept being applied thereto) as the result of a reflow soldering process performed on connections corresponding to the connections 30 when connecting the upper and lower packages of the corresponding stacked semiconductor packages to one another. In this respect, the corresponding lower semiconductor package may warp, as the result of the reflow soldering process, due to different coefficients of thermal expansion (CTE) between the lower package substrate and the molding member thereof. Likewise, the corresponding upper semiconductor package may warp due to different coefficients of thermal expansion (CTE) between the upper package substrate and the molding member thereof.

In the graph of FIG. 2, a point along the X axis represents the temperature (in ° C.) during the reflow soldering process and a point along the Y axis represents the warpage (in μm) that is occurring. Also, the plot 'PKG1' shows the warping of a lower semiconductor package corresponding to the lower semiconductor package 10 as the result of the reflow soldering process, i.e., is a "reflow soldering profile" of the lower semiconductor package. Plot 'PKG2' is a reflow soldering profile of an upper lower semiconductor package corresponding to the upper semiconductor package 20. Note, the warping of the lower semiconductor package was measured between the bottom surface of the lower semiconductor package and a reference surface, and the warping of the upper semiconductor package was measured between the bottom surface of the upper semiconductor package and the reference surface.

In this regard, the reflow soldering process is a process in which the soldering together of two parts is performed by melting a body of prepared solder paste or solder cream (in this case, the connection) provided at a joint between the parts. For example, a Sn/Pb or Sn/Pb/Au solder having a melting point less than that of the base metal of the parts to be joined is provided between the parts and melted. The resulting liquid solder wets the parts and, at the same time, the metal component of the solder diffuses among particles of the base metal of the parts to form an alloy by which the parts are strongly joined together.

The reflow soldering process, used in deriving the graph of FIG. 2, is carried out over several ranges of temperatures, namely, over a heat-up temperature range of from room temperature of, for example, about 25° C., to about 100° C., a soaking temperature range of from about 100° C. to about 200° C., a reflow soldering temperature range of from about 200° C. to a peak value (of about 245° C.), and a cooling temperature range of from about 200° C. to room temperature. In this respect, the reflow soldering temperature range is near the melting point of the solder. However, the melting point of the solder depends on its composition. For example, if the solder includes 96.5% tin (Sn) and 3.5% silver (Ag), the melting point of the solder is about 221° C., and if the solder includes 99.3% Sn and 0.7% copper (Cu), the melting point of the solder is about 227° C. Accordingly, the reflow soldering temperature range depends on the composition of the solder and therefore, FIG. 2 shows the results of just one example of a reflow soldering process.

Referring to FIG. 2, the value of the warpage of the lower semiconductor package at room temperature is negative, meaning that at room temperature the lower semiconductor package warps convexly upwards. On the other hand, at high temperatures, that is, in the reflow soldering temperature range, the value of the warpage of the lower semiconductor package is positive, meaning that the lower semiconductor package has warped convexly downwards at the reflow soldering temperature range. Also, the value of the warpage of the upper semiconductor package is negative at room temperature, meaning that at room temperature the upper semiconductor package warps convexly upwards. On the other hand, once the temperature has increased during the course of the reflow soldering process, the warpage of the upper semiconductor package has a positive value. However, the warpage of the upper semiconductor package has a negative value when the temperature reaches a peak of about 240° C. and thereafter while the temperature decreases and thus, the upper package warps convexly upwards as the results of these temperatures.

Thus, in a temperature range in the vicinity of about 220° C. at which connections corresponding to the connections 30 solidify, the warpage of the lower semiconductor package has a positive value and the warpage of the upper semiconductor package has a negative value. Thus, when the connections solidify, an interval between a central region of the upper semiconductor package and a central region of the lower semiconductor package becomes greater than an interval between an outer peripheral region of the upper semiconductor package and an outer peripheral region of the lower semiconductor package.

In addition, adjacent solder balls of a semiconductor package may be short-circuited as a result of a reflow soldering process of the type referred to above. In particular, it is highly likely that adjacent solder balls of a semiconductor package become short-circuited due to warpage of the semiconductor package and the melting of the solder balls at the reflow soldering temperature range when the gap between the semiconductor package and either a mother board or another semiconductor package is relatively small.

According to an aspect of the inventive concept that will be described in more detail in the following, the heights of the solder connections used to connect a semiconductor package to either a mother board or another semiconductor package are set to be different from each other to compensate for warpage of the semiconductor package in the reflow soldering temperature range. According to another aspect of the inventive concept, the heights of solder connections used to connect a semiconductor package and either a mother board or another semiconductor package are set to be different from each other to keep adjacent solder balls from short-circuiting during the reflow soldering process.

Figure 3:
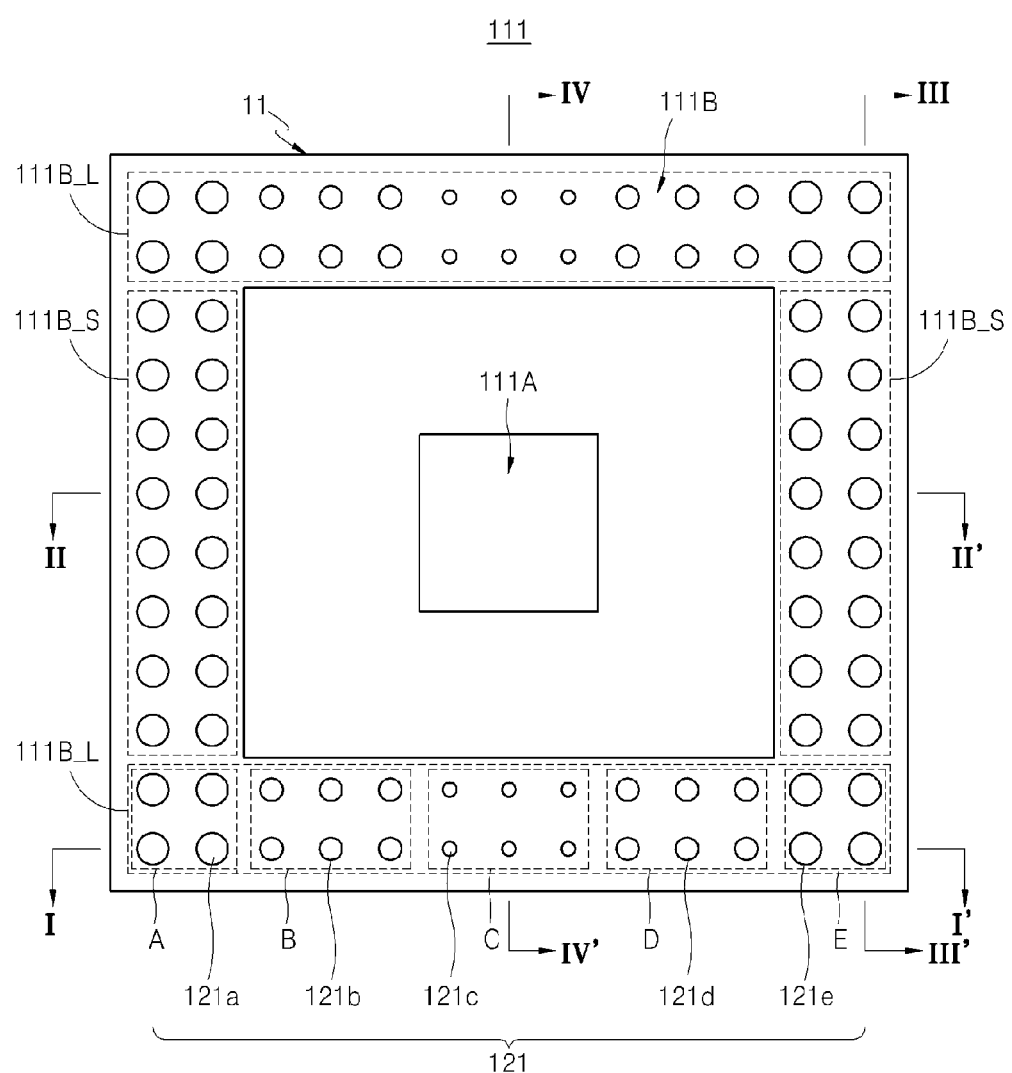
FIG. 3 is a plan view of a lower semiconductor package of the generic or idealized stacked semiconductor package of FIG. 1.

FIG. 3 shows the top surface 111 of the lower semiconductor package 10 of the stacked semiconductor package 1 of FIG. 1.

Referring to FIG. 3, the first electrode pads 121 on the top surface 111 of the lower semiconductor substrate 10 have different sizes in consideration of the warpage that the lower semiconductor package 10 may incur during a reflow soldering process. In this example, the top surface 111 of the lower semiconductor package 10 has a central region 111A on which the first semiconductor chip 14 is mounted and an outer region 111B on which the first electrode pads 121 are disposed. Also, the outer region 111B is sub-divided into longer-side outer regions 111B_L constituted by longer parts of the top surface 111 of the lower semiconductor package 10 extending along first opposite sides of the package 10, respectively, and shorter-side outer regions 111B_S constituted by shorter parts of the top surface 111 of the lower semiconductor package 10 extending along second opposite sides of the package 10, respectively. Each longer-side outer region 111B_L may, in turn, be divided into first through fifth regions A, B, C, D, and E arrayed along the length of the region 111B_L.

In an example of this embodiment, the average size of first electrode pads 121a on the first region A is about 0.24 mm, the average size of first electrode pads 121b on the second region B is about 0.23 mm, the average size of first electrode pads 121c on the third region C is about 0.22 mm, the average size of first electrode pads 121d on the fourth region D is about 0.23 mm, the average size of first electrode pads 121e on the fifth region E is about 0.24 mm.

The shorter-side outer regions 111B_S in this example are not divided into separate regions, and the first electrode pads 121 on the shorter-side outer regions 111B_S have substantially the same sizes. In this example, the first electrode pads 121 on the shorter-side outer regions 111B_S have the same sizes as the first electrode pads 121a and 121e on the first and fifth regions A and E of the longer-side outer regions 111B_L, e.g., the average size of the first electrode pads 121 on the shorter-side outer regions 111B_S and the first and fifth regions A and E is about 0.24 mm.

Figure 4:
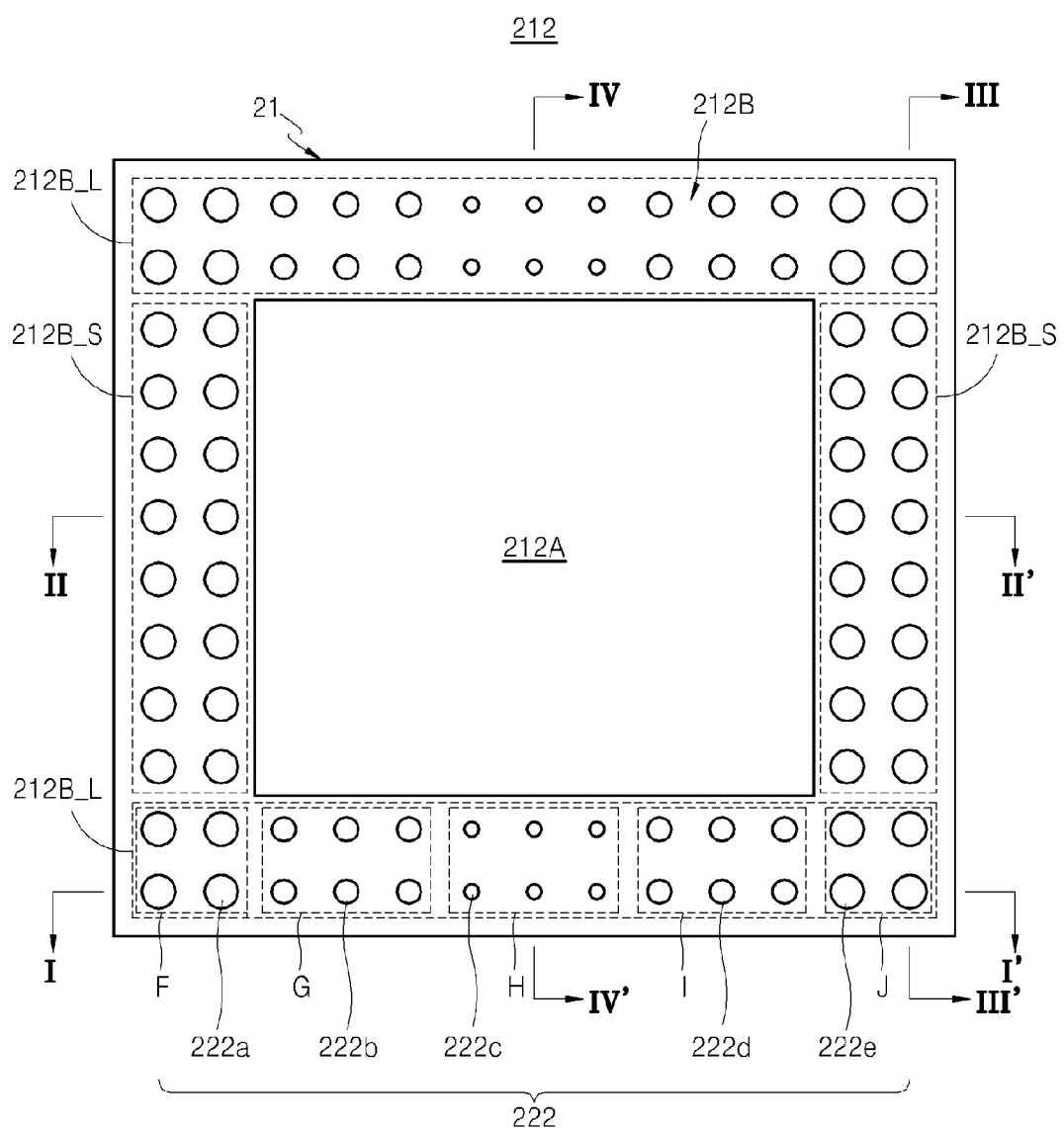
FIG. 4 is a bottom view of an upper semiconductor package of the generic or idealized stacked semiconductor package of FIG. 1.

FIG. 4 shows the bottom surface 212 of the upper semiconductor package 20 of the stacked semiconductor package 1 of FIG. 1

Referring to FIG. 4, the second electrode pads 222 on the bottom surface 212 of the upper semiconductor package 20 have different sizes in consideration of the warpage that the lower semiconductor package 10 may incur during a reflow soldering process. In this respect, the bottom surface 212 of the upper semiconductor package 20 of this example is divided into a central region 212A within the bounds of which the second semiconductor chip 24 is provided, and an outer region 212B on which the second electrode pads 222 are disposed. Also, the outer region 212B is sub-divided into longer-side outer regions 212B_L and shorter-side outer regions 212B_S similar to the bottom surface of the lower semiconductor package 10.

Each longer-side outer region 212B_L in this example is divided into first through fifth regions F, G, H, I, and J arrayed along the length thereof. In this embodiment, again by way of example, the average size of second electrode pads 222a on the first region F is about 0.24 mm, the average size of second electrode pads 222b on the second region G is about 0.23 mm, the average size of second electrode pads 222c on the third region H is about 0.22 mm, the average size of second electrode pads 222d on the fourth region I is about 0.23 mm, and the average size of second electrode pads 222e on the fifth region J is about 0.24 mm.

The shorter-side outer regions 212B_S are not sub-divided into separate regions, and the second electrode pads 222 on the shorter-side outer region 212B_S have substantially the same sizes. Furthermore, the sizes of the second electrode pads 222 on the shorter-side outer regions 212B_S may be identical to the sizes of second electrode pads 222a and 222e on first and fifth regions F and J of the longer-side outer regions 212B_L, i.e., the sizes of the second electrode pads 222 on the shorter-side outer regions 212B_S and the first and fifth regions F and J are each on average about 0.24 mm in this example.

Figure 5:
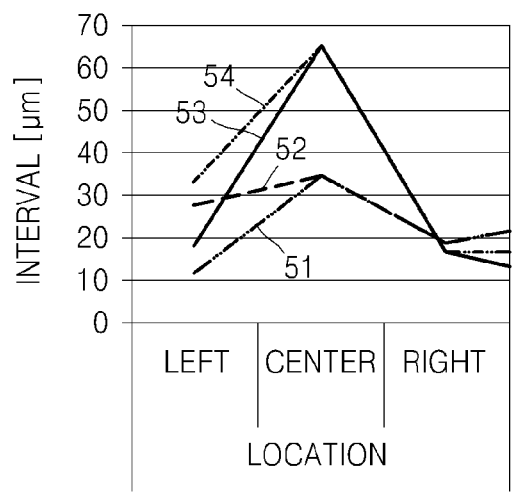
FIG. 5 is a graph of the spacing between the lower semiconductor package and the upper semiconductor package in a space corresponding to the section taken along lines I-I' of FIGS. 3 and 4.

FIG. 5 is a graph of the intervals between lower and upper semiconductor packages of stacked semiconductor packages, in or corresponding to a space aligned with the sections taken along lines I-I' of FIG. 3 and FIG. 4.

In the graph of FIG. 5, a point along the X axis represents the location along the space between the lower and upper semiconductor packages at which the interval is measured, and a point along the Y axis represents the interval between the lower semiconductor package and the upper semiconductor package in units of μm. In this regard, the 'left' part of the X axis of FIG. 5 corresponds to the first and second regions A and B in FIG. 3 and the first and second regions F and G of FIG. 4, the 'center' corresponds to the third region C in FIG. 3 and the third region H of FIG. 4, and the 'right' corresponds to the fourth and fifth regions D and E in FIG. 3 and the fourth and fifth regions I and J in FIG. 4. That is, the X-axis corresponds to the longer outer side of the stacked semiconductor package.

Also, in FIG. 5, the plot '51' indicates the intervals between the lower semiconductor package 10 and the upper semiconductor package 20 along each longer side of the stacked package according to the inventive concept, whereas the plots '52', '53', and '54' are presented as comparative examples of certain conventional semiconductor packages.

As plot '51' shows, the interval between the lower semiconductor package 10 and the upper semiconductor package 20 is about 35 μm in the 'center', about 10 μm in the 'left', and about 20 μm in the 'right' due to warpage in the lower semiconductor package 10 and the upper semiconductor package 20 during the reflow soldering process.

Figure 6:
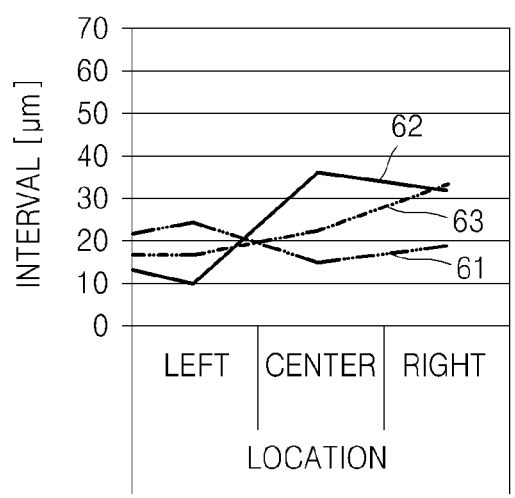
FIG. 6 is a graph of the spacing between the lower semiconductor package and upper semiconductor package in a space corresponding to the section taken along lines III-III' of FIGS. 3 and 4.

FIG. 6 is a graph of the intervals between lower and upper semiconductor packages of stacked semiconductor packages, in or corresponding to a space aligned with the sections taken along lines III-III' of FIG. 3 and FIG. 4, due to warpage in the lower semiconductor package 10 and the upper semiconductor package 20 during a reflow soldering process.

In the graph of FIG. 6, a point along the X axis represents the location along the space between the lower and upper semiconductor packages at which the interval is measured, and a point along the Y axis represents the interval in units of μm between the lower semiconductor package and the upper semiconductor package. In this regard, the 'left' part of the X axis corresponds to a region adjacent the letter III in FIGS. 3 and 4, the 'right' corresponds to a region adjacent to the letter III' in FIGS. 3 and 4, and the 'center' corresponds to a region therebetween. That is, the X-axis corresponds to the shorter outer sides of the stacked semiconductor package.

Also, in FIG. 6, the plot '61' indicates the intervals between the lower semiconductor package 10 and the upper semiconductor package 20 of the stacked package according to the inventive concept, whereas the plots '62' and '63' are presented as comparative examples of certain conventional semiconductor packages.

As the plot '61' shows, the interval between the lower semiconductor package 10 and the upper semiconductor package 20 at the 'center' is about 15 μm, which is very similar to the interval between the lower semiconductor package 10 and the upper semiconductor package 20 at the 'right'. Also, as the plot '63' shows, the interval between the lower semiconductor package 10 and the upper semiconductor package 20 at the 'center' is about 25 μm, which is very similar to the interval between the lower semiconductor package 10 and the upper semiconductor package 20 at the 'left'.

Figure 7:
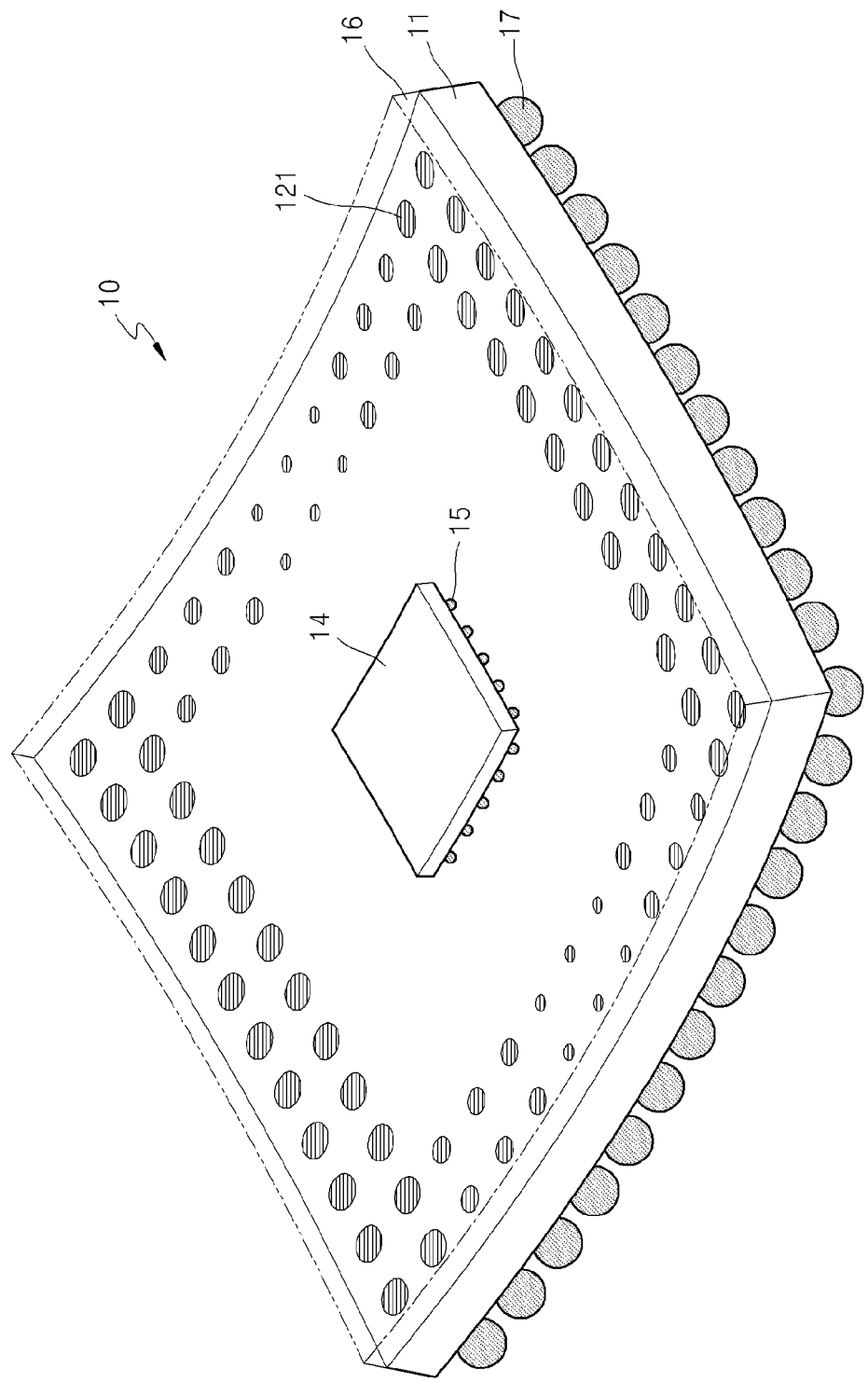
FIG. 7 is a perspective view of the lower semiconductor package of FIG. 1 as the result of a reflow soldering process.
Figure 8:
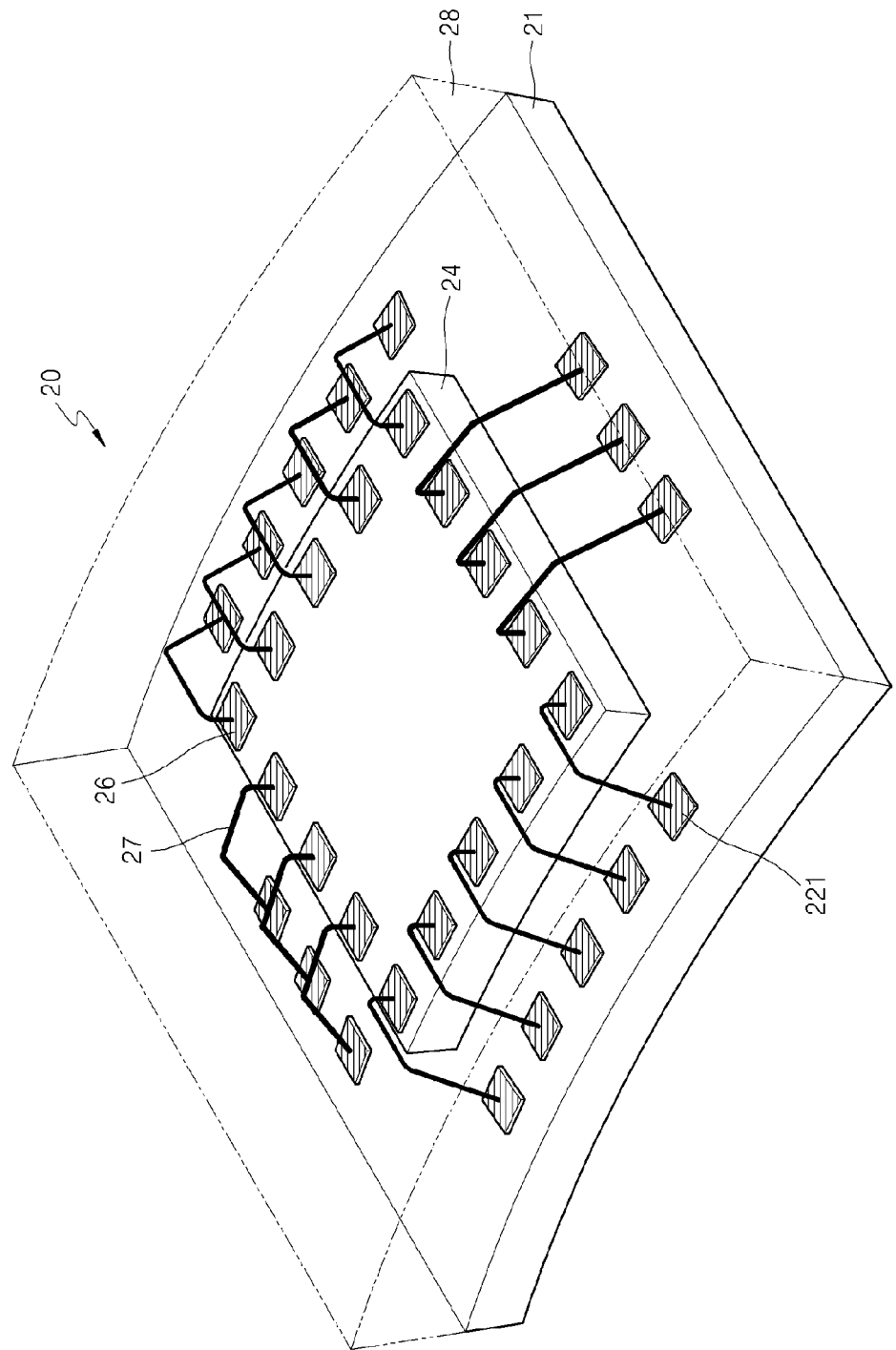
FIG. 8 is a perspective view of the upper semiconductor package of FIG. 1 as the result of the reflow soldering process.

FIG. 7 is a perspective view of the lower semiconductor package 10 of FIG. 3, and FIG. 8 is a perspective view of the upper semiconductor package 20 of FIG. 4.

Referring to FIGS. 7 and 8, the lower semiconductor package 10 is convex in a downward direction and more specifically, the longer (first) sides of the bottom surface 112 of the substrate of the lower semiconductor package are convex and the longer (first) sides of the top surface 111 thereof are concave. In particular, the degree to which longer opposite sides of the lower semiconductor package 10 is warped is relatively high, and the degree to which the shorter opposite sides of the lower semiconductor package 10 is warped is so relatively low as to be negligible.

The upper semiconductor package 20 is convex in an upward direction and more specifically, the longer sides of the bottom surface 212 of the substrate of the lower semiconductor package are concave and the longer sides of the top surface 111 thereof are convex. In particular, like the lower semiconductor package 10, the degree to which longer (first) sides of the upper semiconductor package 20 is warped is relatively high, and the degree to which shorter (second) sides of the upper semiconductor package 20 is warped is so relatively low as to be negligible.

Thus, along the longer sides of the lower semiconductor package 10 and the upper semiconductor package 20, the interval between the lower semiconductor package 10 and the upper semiconductor package 20 is largest at central regions thereof and decrease toward outer regions of the longer sides. Also, at the shorter sides of the lower semiconductor package 10 and the upper semiconductor package 20, the intervals between the lower semiconductor package 10 and the upper semiconductor package are substantially the same.

Figure 9:
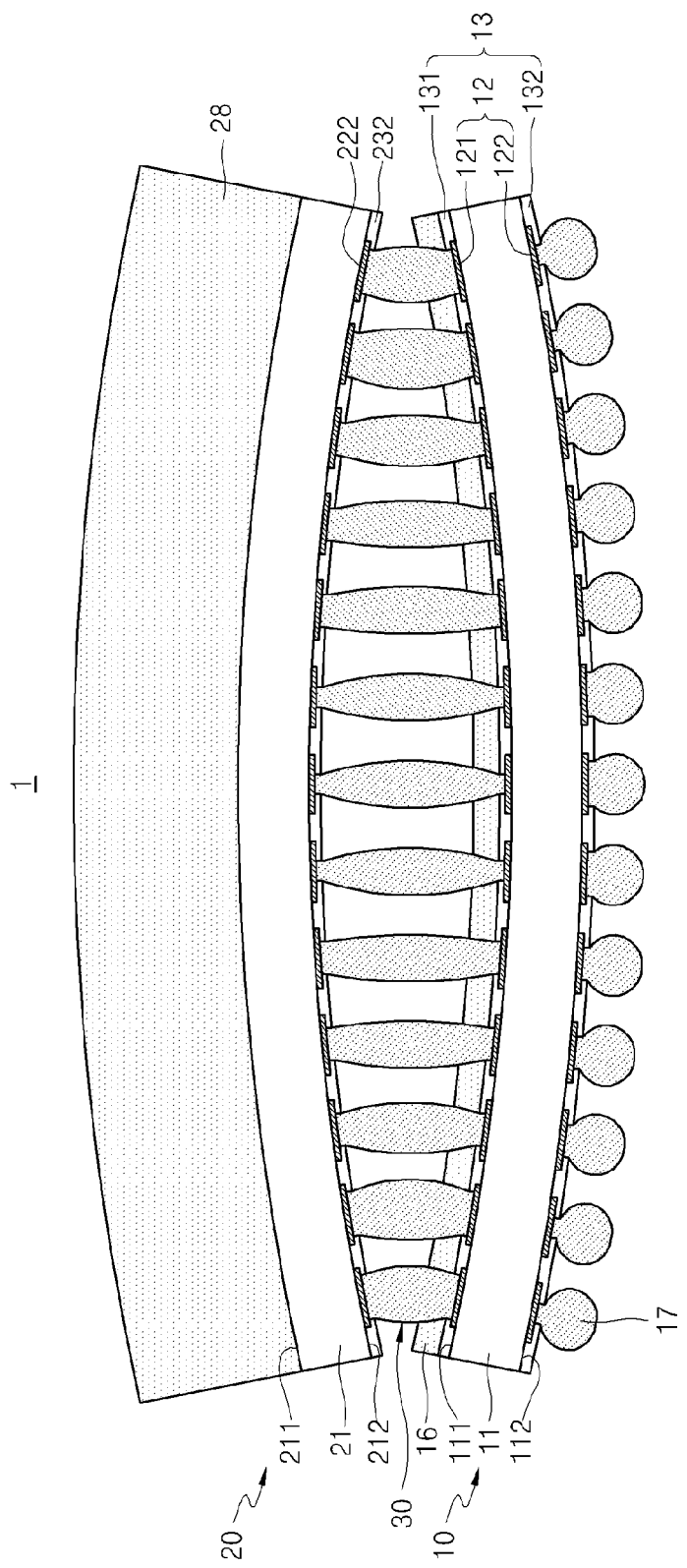
FIG. 9 is a cross-sectional view of an embodiment of a stacked semiconductor package 1 taken along lines I-I' of FIGS. 3 and 4, according to the inventive concept.

FIG. 9 is a cross-sectional view of an example of the stacked semiconductor package 1 taken along lines I-I' of FIGS. 3 and 4.

Referring to FIGS. 3, 4 and 9, the lower semiconductor package 10 is convex downwards and the upper semiconductor package 20 is convex upwards. Thus, heights of the connections 30 interposed between the lower semiconductor package 10 and the upper semiconductor package 20 are different from each other. Specifically, the heights of the connections 30 decrease along each of opposite longer first sides of the first semiconductor package 1 from central to outer regions of each first side.

Furthermore, in the illustrated example of the present embodiment, the sizes of the exposed areas of the top surfaces of the first electrode pads 121 disposed along each outer region 111B_L of the lower semiconductor package 10 differ from each other. In particular, the exposed areas increase in size from the central to the outer regions of each longer side of the stacked semiconductor package 1, as illustrated in FIG. 3. Also, the sizes of exposed areas of the top surfaces of the second electrode pads 222 disposed along each first outer region 212B_L of the upper semiconductor package 20 differ from each other. In particular, these exposed areas also increase in size from the central to the outer regions of each longer side of the stacked semiconductor package 1, as illustrated in FIG. 4.

In another example, the sizes of the exposed areas of the top surfaces of the first electrode pads 121 disposed along each longer first side of the lower semiconductor package 10 increase in size from the central to the outer regions of each first side of the stacked semiconductor package 1, whereas the sizes of the exposed areas of the top surfaces of the second electrode pads 222 disposed along each longer first side of the upper semiconductor package 20 are the same.

In still another example, the sizes of the exposed areas of the top surfaces of the first electrode pads 121 disposed along each longer first side of the lower semiconductor package 10 are substantially the same, whereas the sizes of the exposed areas of the top surfaces of the second electrode pads 222 disposed along each longer first side of the upper semiconductor package 20 increase in size from the central to the outer regions of each longer side of the stacked semiconductor package 1.

When the reflow soldering process is performed on equal volumes of solder interposed between the first electrode pads 121 and the second electrode pads 222, respectively, the sizes the exposed areas of the top surfaces of the first electrode pads 121 and/or the second electrode pads 222 determine the heights of the connections 30 formed by the reflow soldering process. Specifically, the larger the exposed areas are, the wider the connections 30 become and thus, the shorter the connections 30 become as well. Thus, the heights of each set of connections 30, disposed along a first side of the stacked semiconductor package 1 (corresponding to regions 111B_L and 211B_L in FIGS. 3 and 4), decrease from the central to the outer regions of the longer sides in any of the examples described above.

In another embodiment, the sizes of the exposed areas of the top surfaces of the first electrode pads 121 along each outer region 111B_L of the lower semiconductor package 10 may be substantially the same, and the sizes of the exposed areas of the top surfaces of the second electrode pads 222 along each outer region 212B_L of the upper semiconductor package 20 may be substantially the same. In this case, the bodies of solder used to form the connections 30 along each first side of the stacked semiconductor package 1, respectively, have different volumes and hence, these connections 30 have different volumes as well. In particular, the volumes of each set of connections 30 disposed along a first longer side of the stacked semiconductor package 1 (corresponding to regions 111B_L and 211B_L in FIGS. 3 and 4 decrease from the central to the outer regions of the first side and correspondingly, the heights of the connections 30 of each such set decrease from the central to the outer regions of the first side.

Figure 10:
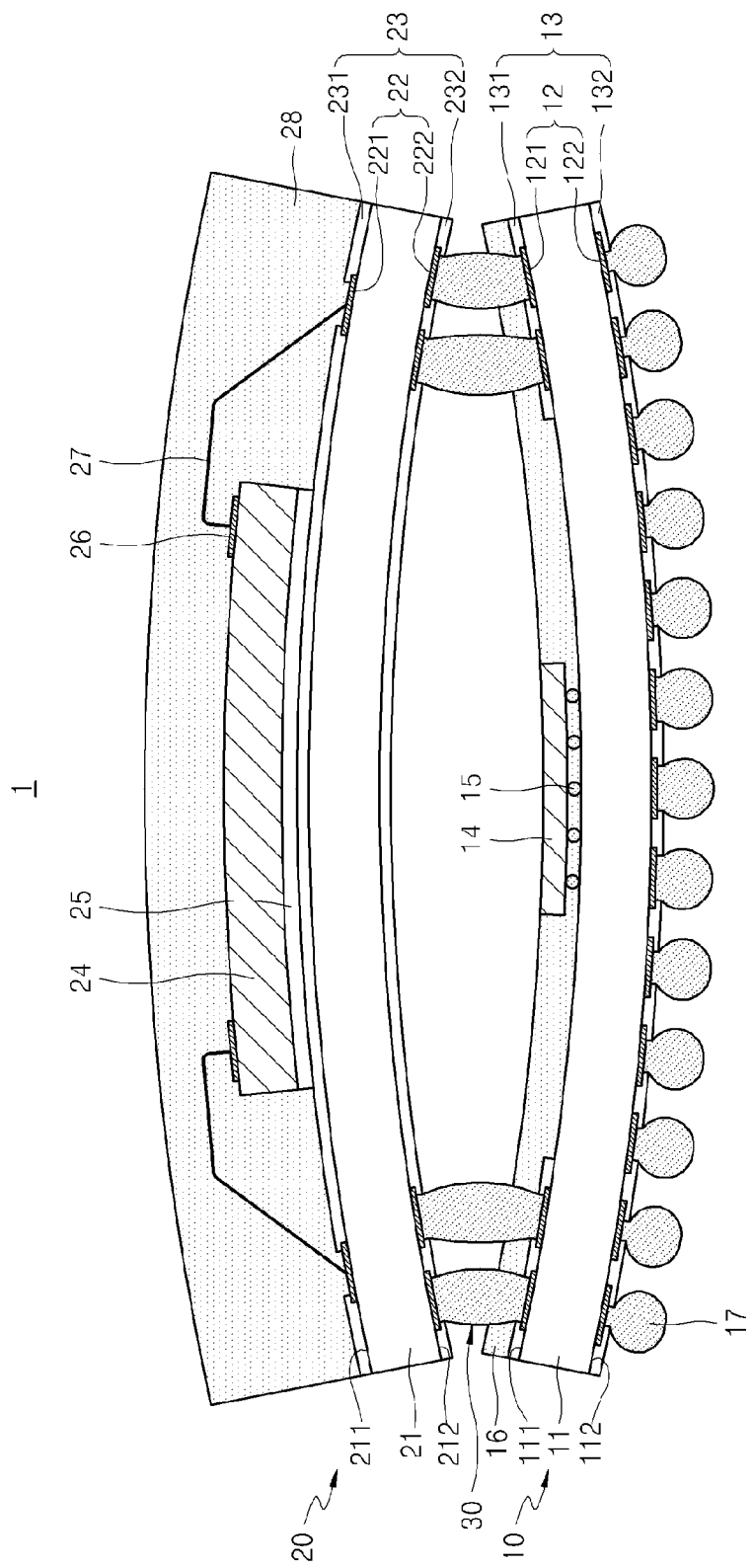
FIG. 10 is a cross-sectional view of the stacked semiconductor package of FIG. 9 taken along lines II-II' of FIGS. 3 and 4.

FIG. 10 shows a section of the stacked semiconductor package 1 taken along lines II-II' of FIGS. 3 and 4.

Referring to FIG. 10, in this section there are no electrode pads disposed on the central region 111A of the upper surface 111 of the substrate 11 of the lower semiconductor package 10. Rather, electrode pads 121 are only disposed on the outer region 111B_S and in this case, the sizes of the exposed areas of the top surfaces of the first electrode pads 121 on the outer region 111B_S are substantially the same. Likewise, no electrode pads are disposed on the central region 212A of the lower surface 212 of the substrate 21 of the upper semiconductor package 20. Rather, electrode pads 121 are disposed only on the outer region 212B_S and in this case, the sizes of the exposed areas of the top surfaces of the second electrode pads 222 on the outer region 212B_S are substantially the same.

Figure 11:
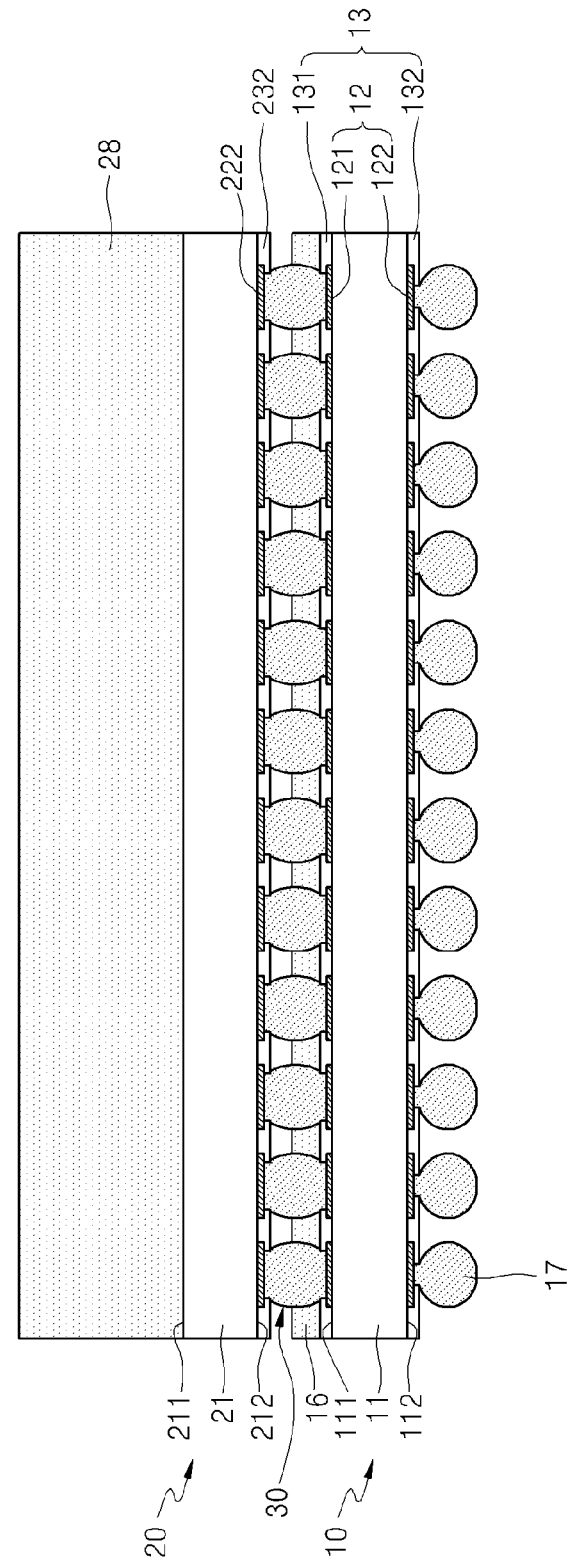
FIG. 11 is a cross-sectional view of the stacked semiconductor package of FIG. 9 taken along lines III-III' of FIGS. 3 and 4.

FIG. 11 shows a section of the stacked semiconductor package 1 taken along lines III-III' of FIGS. 3 and 4.

Referring to FIGS. 3, 4 and 11, the heights of the connections 30 disposed between the lower semiconductor package 10 and the upper semiconductor package 20, along each shorter (second) side of the stacked semiconductor package (corresponding to outer regions 111B_S and 212B_S), are substantially the same.

Along this section of the stacked semiconductor package 10, the sizes of the exposed areas of the top surfaces of the first electrode pads 121 of the lower semiconductor package 10 are substantially the same. Likewise, along this section, the sizes of the exposed areas of the top surfaces of the second electrode pads 222 are substantially the same. Thus, when equal volumes of solder are used between the first electrode pads 121 and the second electrode pads 222 disposed along the outer regions 111B_S and 212B_S, the heights of the connections 30 formed by the soldering reflow process will be substantially the same. In this regard, the heights of the connections 30 along this section may be substantially the same as heights of the connection(s) 30 (two, in the illustrated example) disposed at the outermost region of the section illustrated in FIG. 9.

Figure 12:
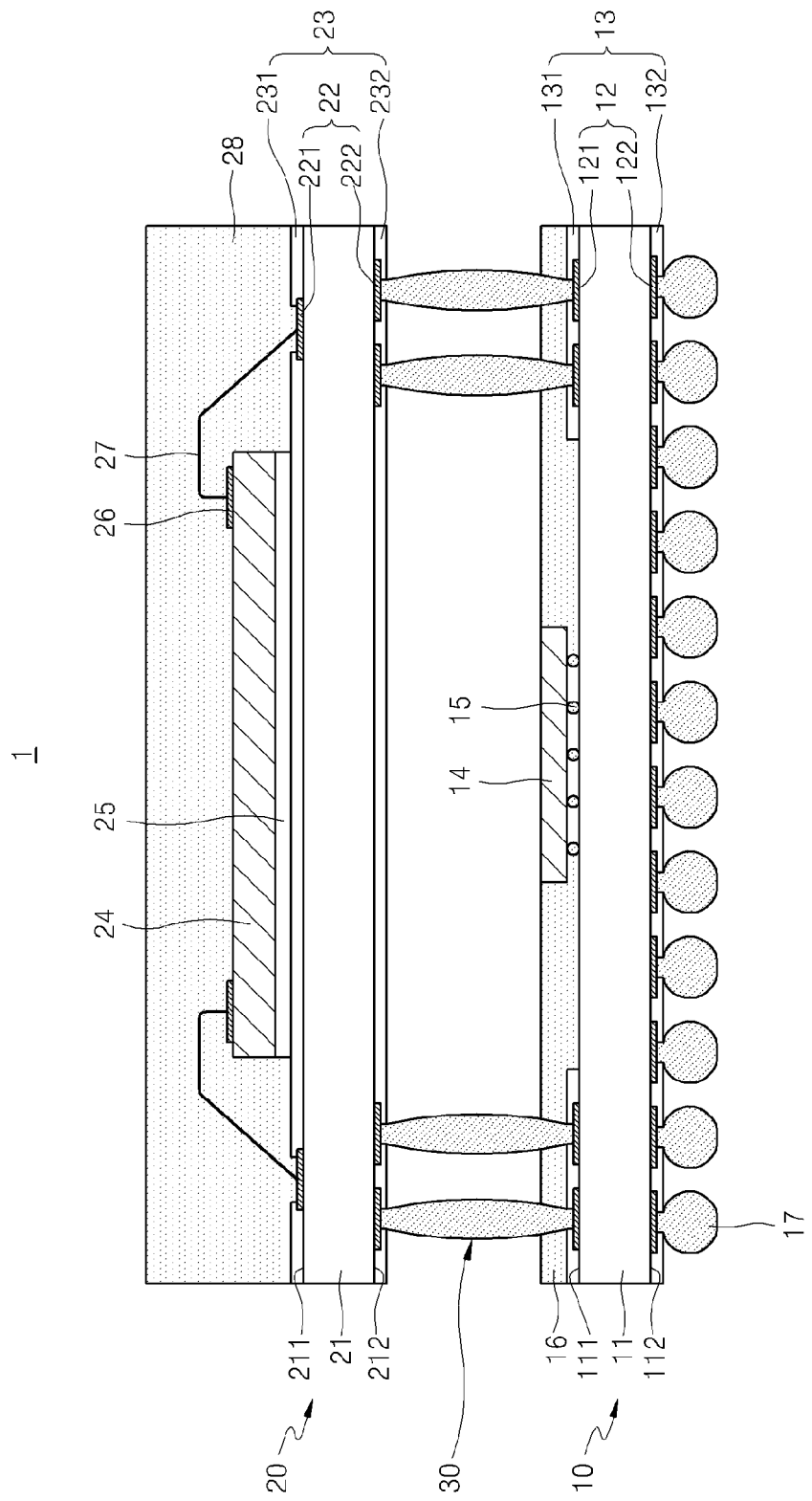
FIG. 12 is a cross-sectional view of the stacked semiconductor package of FIG. 9 taken along lines IV-IV' of FIGS. 3 and 4.

FIG. 12 shows a section of the stacked semiconductor package 1 taken along lines IV-IV' of FIGS. 3 and 4.

Referring to FIGS. 3, 4 and 12, along this section, no electrode pads are disposed on the central region 111A. Rather, first electrode pads 21 are disposed only on the outer region 111B_L and in this case, the sizes of the exposed areas of the top surfaces of the first electrode pads 121 on the outer region 111B_L are substantially the same. Also, along this section, no electrode pads are disposed on the central region 212A. Rather, second electrode pads 222 are disposed only on the outer region 212B_L and in this case, the sizes of the exposed areas of the top surfaces of the second electrode pads 222 are substantially the same. Thus, when equal volumes of solder are used between the first electrode pads 121 and the second electrode pads 222 at the central region C of the outer regions 111B_L and 212B_L, the heights of the connections 30 formed by the soldering reflow process will be substantially the same.

Figure 13:
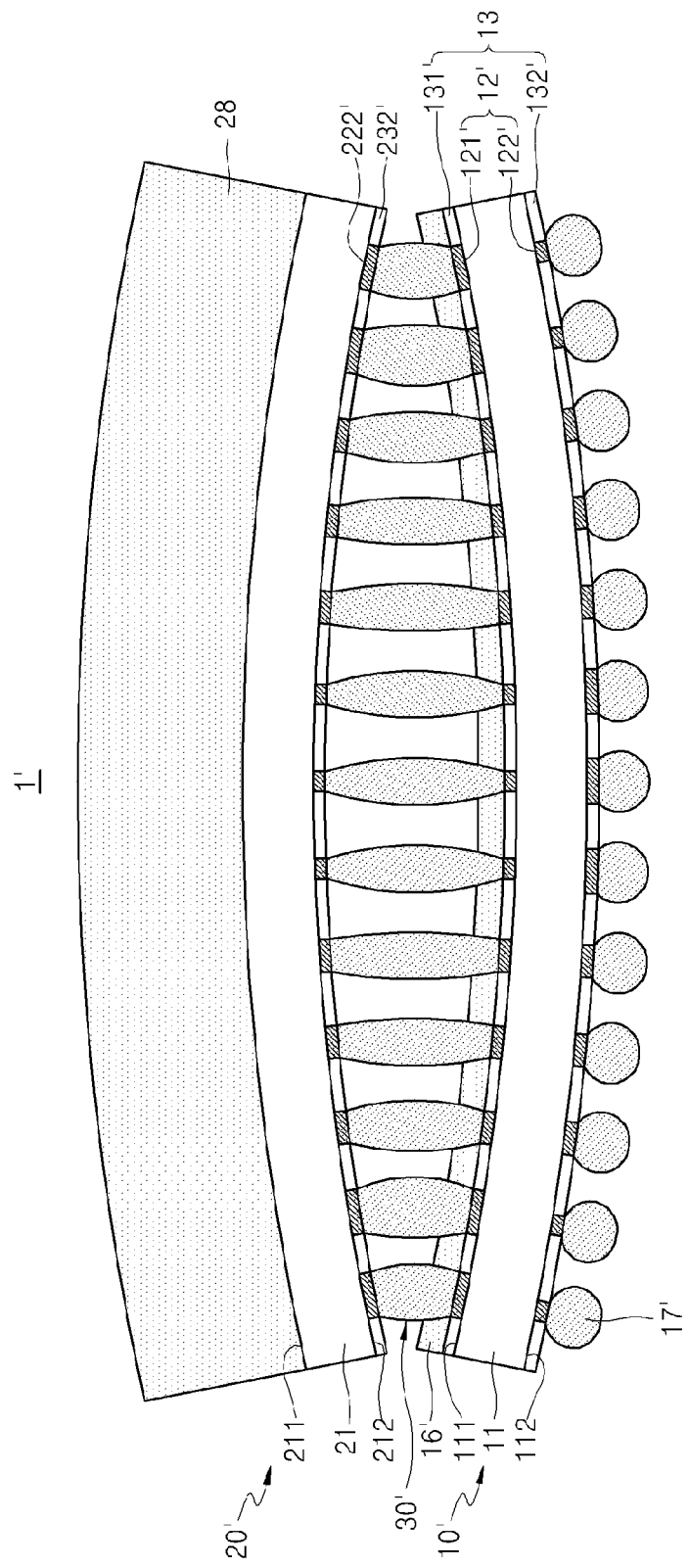
FIG. 13 is a cross-sectional view of another embodiment of a stacked semiconductor package taken along lines I-I' of FIGS. 3 and 4.

FIG. 13 is a cross-sectional view of another embodiment of a stacked semiconductor package 1'. This embodiment is similar to that shown in and described above with respect to FIGS. 1 and 3-12 and the cross-section view of this embodiment corresponds to that taken along lines I-I' of FIGS. 3 and 4 wherein the relative sizes of the electrode pads themselves and more particular, the top surfaces of the electrode pads in their entirety are shown as will become clearer from the description that follows.

Referring to FIGS. 3, 4 and 13, at each longer first side of the stacked semiconductor package 1', the lower semiconductor package 10' is convex downwards, and the upper semiconductor package 20' is convex upwards. Thus, the heights of the connections 30' disposed along each longer side of the of the stacked semiconductor package 1' decrease from a central to outer regions of the first side similarly to the embodiment described above.

In this embodiment, though, in the lower semiconductor package 10', the first protection layer 131' disposed on the top surface 111 of the lower package substrate 11 covers the side surfaces of first electrode pads 121' but exposes the entire upper surface of each first electrode pad 121'. Similarly, the second protection layer 132' disposed on the bottom surface 112 of the lower package substrate 11 covers the side surfaces of second electrode pads 122' but exposes the entire top surface of each second electrode pad 122'. Also, in the upper semiconductor package 20', the second protection layer 232' disposed on the bottom surface 212 of the upper package substrate 21 covers the side surfaces of second electrode pads 222' but exposes the entire top surface of each second electrode pad 222'. As was mentioned earlier, this structure is referred to as an NSMD-type interconnection line substrate. That is, in the NSMD-type interconnection line substrate, the size of an electrode pad refers to the area of the top surface of the electrode pad.

The sizes of the first electrode pads 121' of the lower semiconductor package 10' differ from each other and, in particular, increase from the central to the outer regions along each longer side of the stacked semiconductor package 1' as exemplified by the relative sizes of the first electrode pads 121a, 121b, 121c, 121d, and 121e illustrated in FIG. 3. Also, the sizes of the second electrode pads 222' of the upper semiconductor package 20' differ from each other and, in particular, increase from the central to the outer regions along each longer side of the stacked semiconductor package 1' as exemplified by the relative sizes of the second electrode pads 222a, 222b, 222c, 222d, and 222e illustrated in FIG. 4.

When the reflow soldering process is performed on equal volumes of solder interposed between the first electrode pads 121' and the second electrode pads 222', respectively, the sizes of the first electrode pads 121' and/or the second electrode pads 222' determine the heights of the connections 30' formed by the reflow soldering process. Specifically, the larger the electrode pads are, the wider the connections 30 become and thus, the shorter the connections 30' become as well. Thus, the heights of each set of connections 30, disposed along a longer first side of the stacked semiconductor package 1' (corresponding to regions 111B_L and 211B_L in FIGS. 3 and 4), decrease from the central to the outer regions of the first side in any of the examples described above.

In another example of this embodiment, the sizes of the first electrode pads 121' on the outer region 111B_L of the lower semiconductor package 10' increase from the central to the outer regions along the first side of the stacked semiconductor package 1', and the sizes of the second electrode pads 222' on the outer region 212B_L of the upper semiconductor package 20' are substantially the same.

In another example of this embodiment, the sizes of the second electrode pads 222' on the outer region 212B_L of the upper semiconductor package 20' increase from the central to the outer regions of the first side of the stacked semiconductor package 1', and the sizes of the first electrode pads 121' on the outer region 111B_L of the lower semiconductor package 10' are substantially the same.

Even in these examples, the heights of the connection portions 30' will decrease from the central to the outer regions of each longer first side of the stacked semiconductor package 1', for the reasons explained above.

In another embodiment, the sizes of the first electrode pads 121' along each outer region 111B_L of the lower semiconductor package 10 may be substantially the same, and the sizes of the second electrode pads 222' along each outer region 212B_L of the upper semiconductor package 20 may be substantially the same. In this case, the bodies of solder used to form the connections 30' along each longer first side of the stacked semiconductor package 1', respectively, have different volumes and hence, these connections 30' have different volumes as well. In particular, the volumes of each set of connections 30' disposed along a longer first side of the stacked semiconductor package 1 (corresponding to regions 111B_L and 211B_L in FIGS. 3 and 4 decrease from the central to the outer regions of the first side and correspondingly, the heights of the connections 30' of each such set decrease from the central to the outer regions of the first side.

Figure 14:
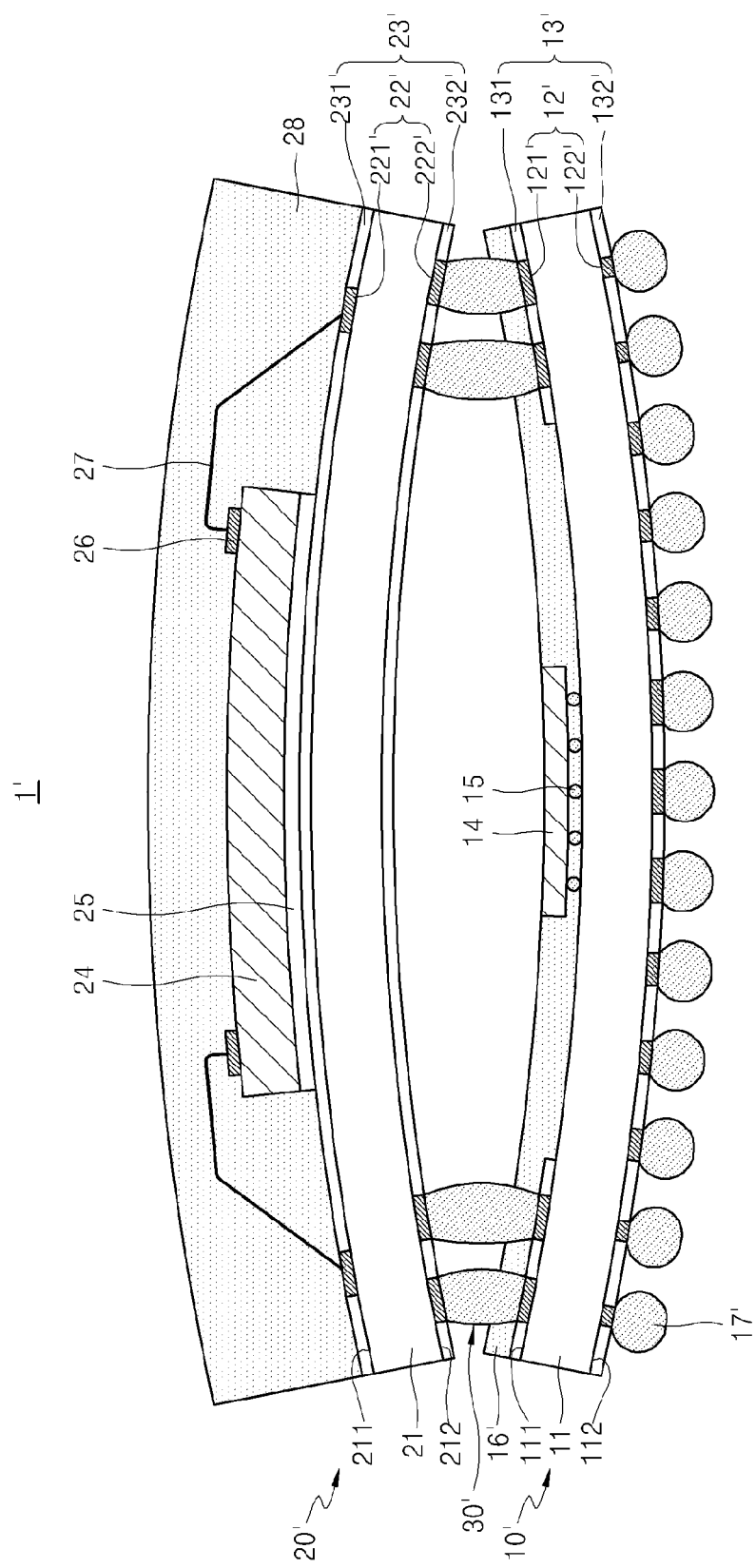
FIG. 14 is a cross-sectional view of the embodiment of the stacked semiconductor package of FIG. 13 as taken along lines II-II' of FIGS. 3 and 4.
Figure 15:
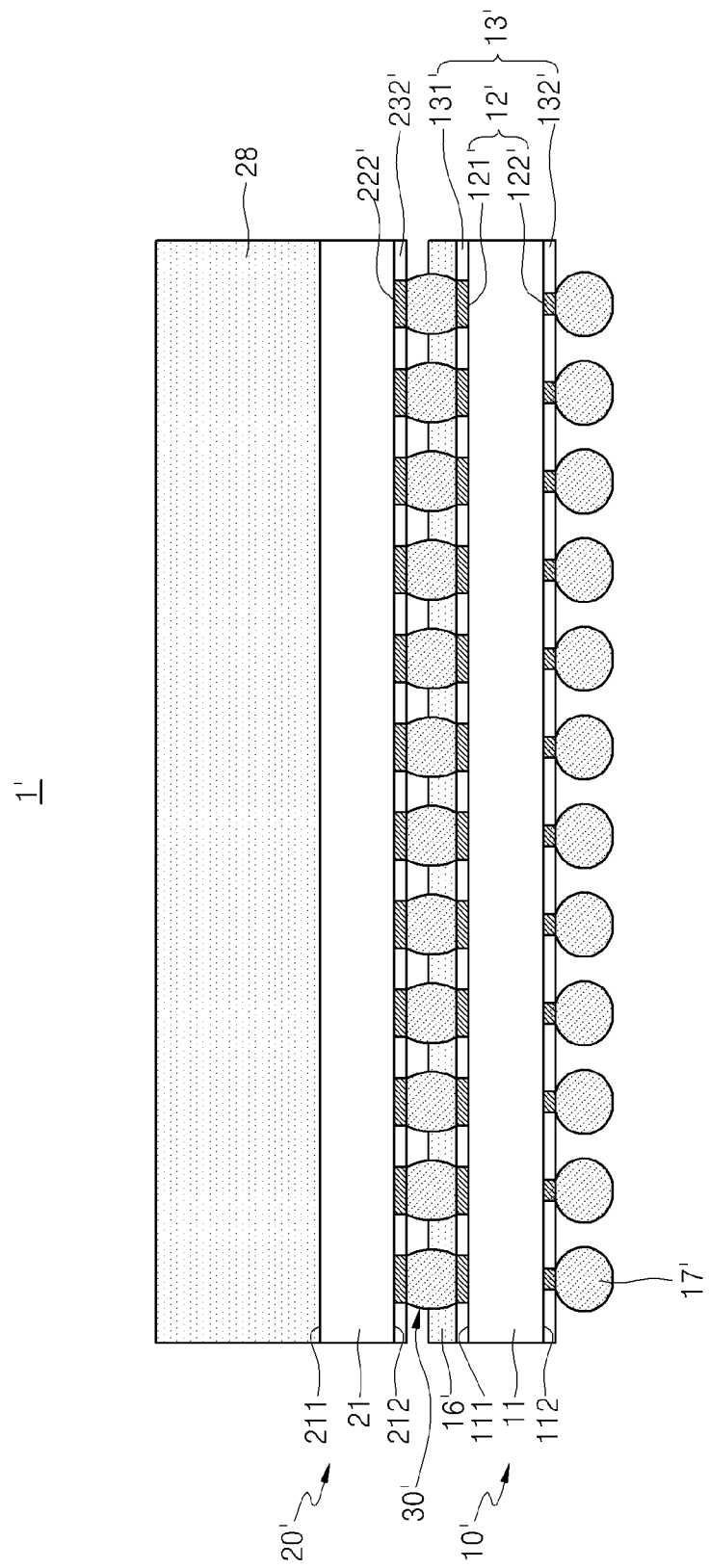
FIG. 15 is a cross-sectional view of the embodiment of the stacked semiconductor package of FIG. 13 as taken along lines III-III' of FIGS. 3 and 4.
Figure 16:
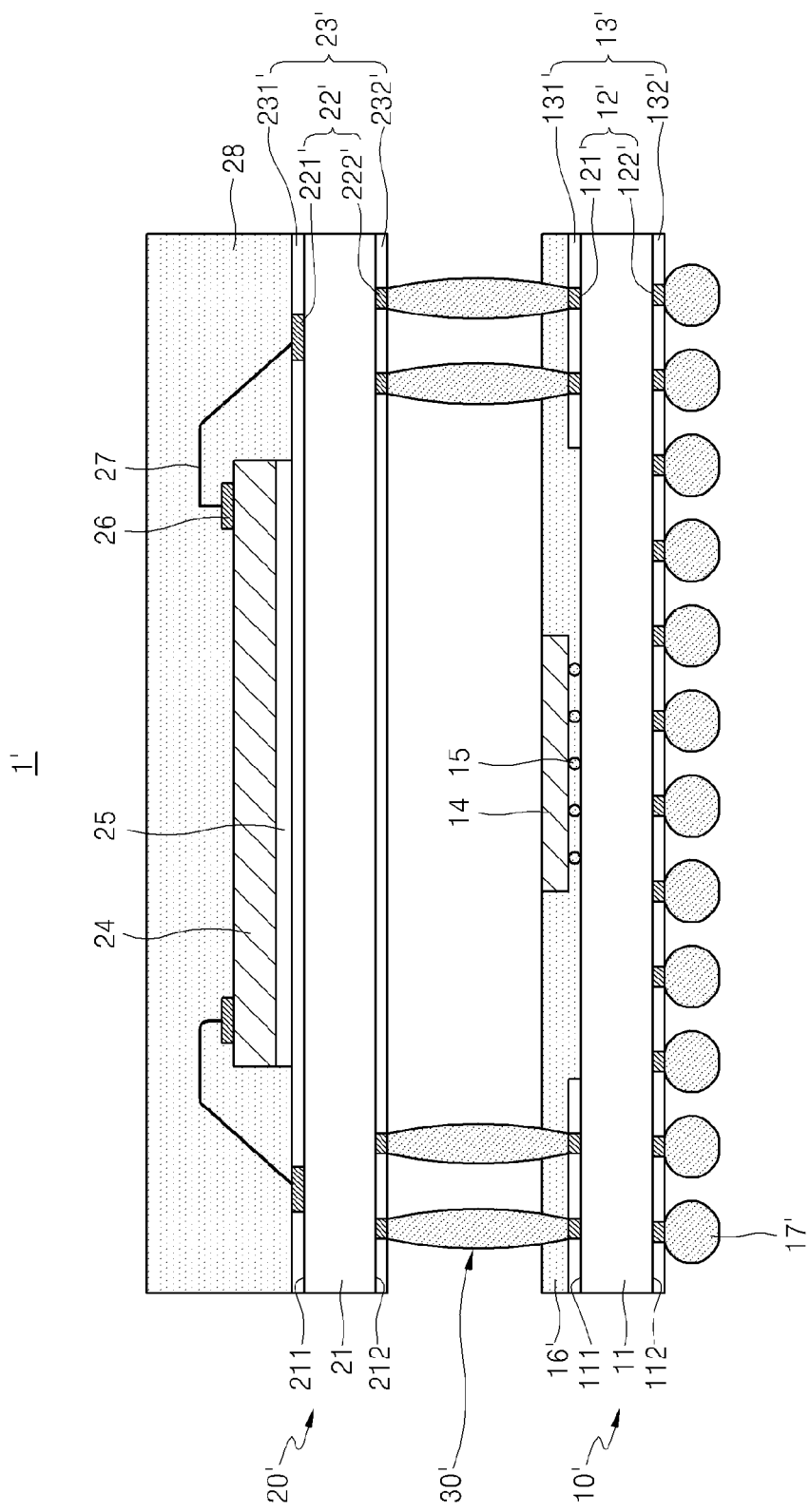
FIG. 16 is a cross-sectional view of the embodiment of the stacked semiconductor package of FIG. 13 as taken along lines IV-IV' of FIGS. 3 and 4.

FIGS. 14-16 are sectional views of the stacked semiconductor package 1' taken along lines II-II', III-III' and IV' of FIGS. 3 and 4, wherein reference numerals 121a-121e and 222a-222b show the relative sizes of the electrode pads themselves in section and more particular, the relative sizes of the exposed top surfaces as was mentioned above. Because the aspects/features shown in these figures are similar to those described in the corresponding sectional views of FIGS. 10-12 and thus evident from the descriptions of FIGS. 10-12, such aspects/features of this embodiment of the stacked semiconductor package 1' will not be described in further detail.

Figure 17:
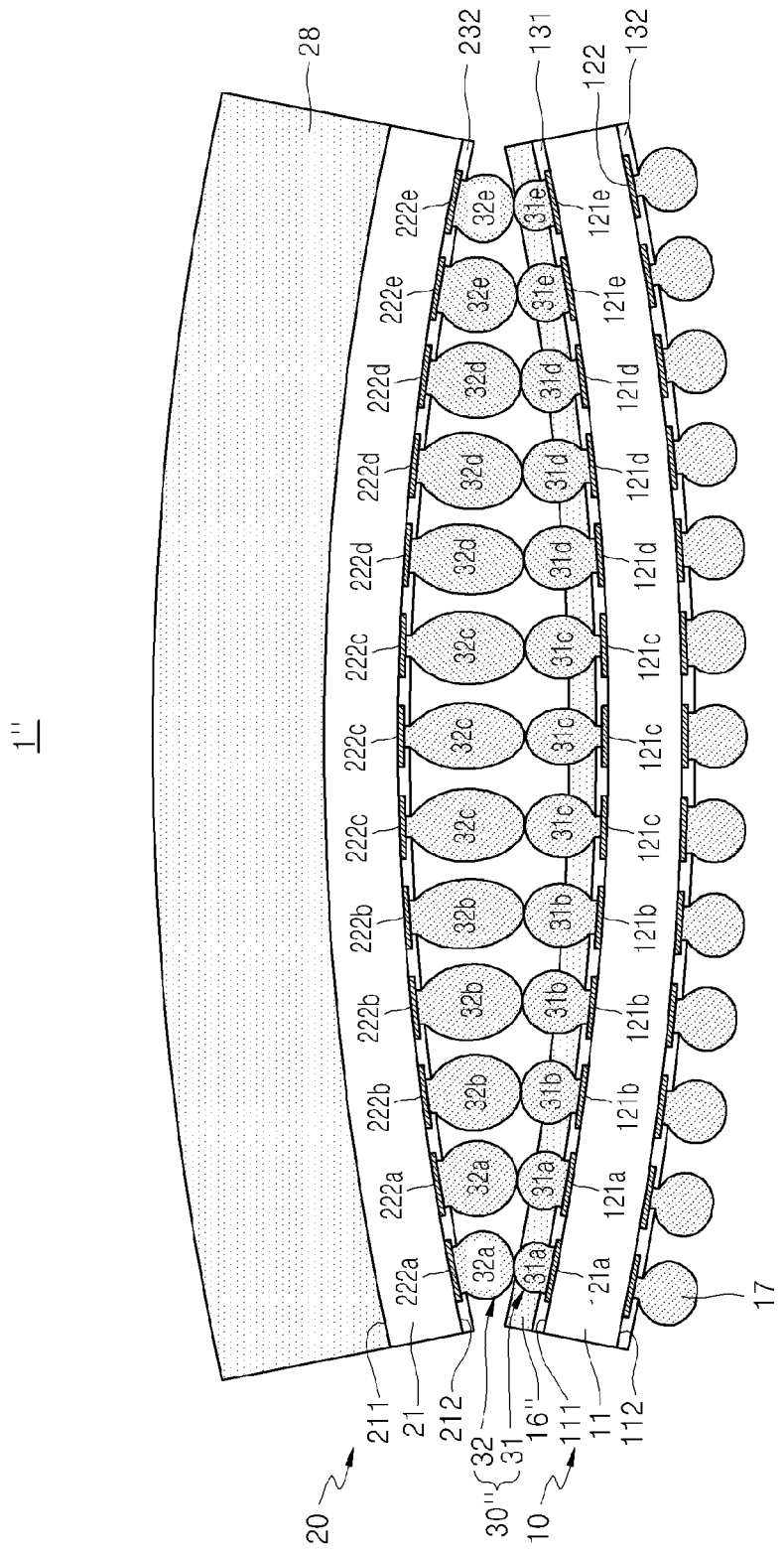
FIG. 17 is a cross-sectional view of another embodiment of a stacked semiconductor package as taken along lines I-I' of FIGS. 3 and 4.

FIG. 17 is a cross-sectional view of another embodiment of a stacked semiconductor package 1" according to the inventive concept, as taken along lines I-I' of FIGS. 3 and 4 which in this case, again, show the relative sizes of exposed central areas of the top surfaces of the electrode pads.

Referring to FIGS. 3, 4 and 17, the lower semiconductor package 10 is convex downwards and the upper semiconductor package 20 is convex upwards. Thus, heights of the connections 30" interposed between the lower semiconductor package 10 and the upper semiconductor package 20 are different from each other. Specifically, the heights of the connections 30" decrease along each of opposite longer first sides of the first semiconductor package 1" from central to outer regions of each first side.

In this embodiment of a stacked semiconductor package 1", each of the connections 30" includes a first contact electrode 31 and a second contact electrode 32 electrically connected to each other. Each first contact electrode 31 is electrically connected to a respective first electrode pad 121 of the lower semiconductor package 10, and each second contact electrode 32 is electrically connected to a respective second electrode pad 222 of the upper semiconductor package 20.

In the example illustrated in FIG. 17, the first and second contact electrodes 31 and 32 each are spherical solder balls. However, the contact electrodes of at least one of the sets of first and second of contact electrodes 31 and 32 may instead be hemispherical. Alternatively, the contact electrodes of at least one of the sets of first and second contact electrodes 31 and 32 may be mesa-shaped, cylindrical, or polygonal pillar-shaped. In addition, a conductive member (interposer) may be disposed between the set of first contact electrodes 31 and set of second contact electrodes 32.

In any case, by providing the first and second contact electrodes 31 and 32 on the lower semiconductor package 10 and the upper semiconductor package 20, respectively, short-circuiting of the first electrode pads 121 and the second electrode pads 222 can be prevented when the lower semiconductor package 10 and the upper semiconductor package 20 are warped.

As also illustrated in the embodiment of FIG. 17, the heights of the second contact electrodes 32 are greater than the heights of the corresponding (i.e., electrically connected) first contact electrodes 31, respectively. For example, the heights of first contact electrodes 31a and 31e on the first electrode pads 121a and 121e may be about 0.155 mm, the heights of first contact electrodes 31b and 31d on the first electrode pads 121b and 121d may be about 0.160 mm, and the heights of first contact electrodes 31c on the first electrode pads 121c may be about 0.167 mm. Also, the heights of second contact electrodes 32a and 32e on the second electrode pads 222a and 222e may be about 0.188 mm, the heights of the second contact electrodes 32b and 32d on the second electrode pads 222b and 222d may be about 0.193 mm, and the heights of the second contact electrodes 32c on the second electrode pads 222c may be about 0.198 mm.

However, the heights of the first contact electrodes 31 may instead be greater than the heights of the corresponding second contact electrodes 32. Alternatively, the heights of the first contact electrodes 31 may be identical to the heights of the corresponding second contact electrodes 32.

Furthermore, in the illustrated example of the embodiment of FIG. 17, the sizes of the exposed areas of the top surfaces of the first electrode pads 121a-112e disposed along each outer region 111B_L of the lower semiconductor package 10 differ from each other. In particular, the exposed areas increase in size from the central to the outer regions of each first side of the stacked semiconductor package 1". Also, the sizes of exposed areas of the top surfaces of the second electrode pads 222a-222e disposed along each first outer region 212B_L of the upper semiconductor package 20 differ from each other. In particular, these exposed areas also increase in size from the central to the outer regions of each longer first side of the stacked semiconductor package 1".

Figure 18:
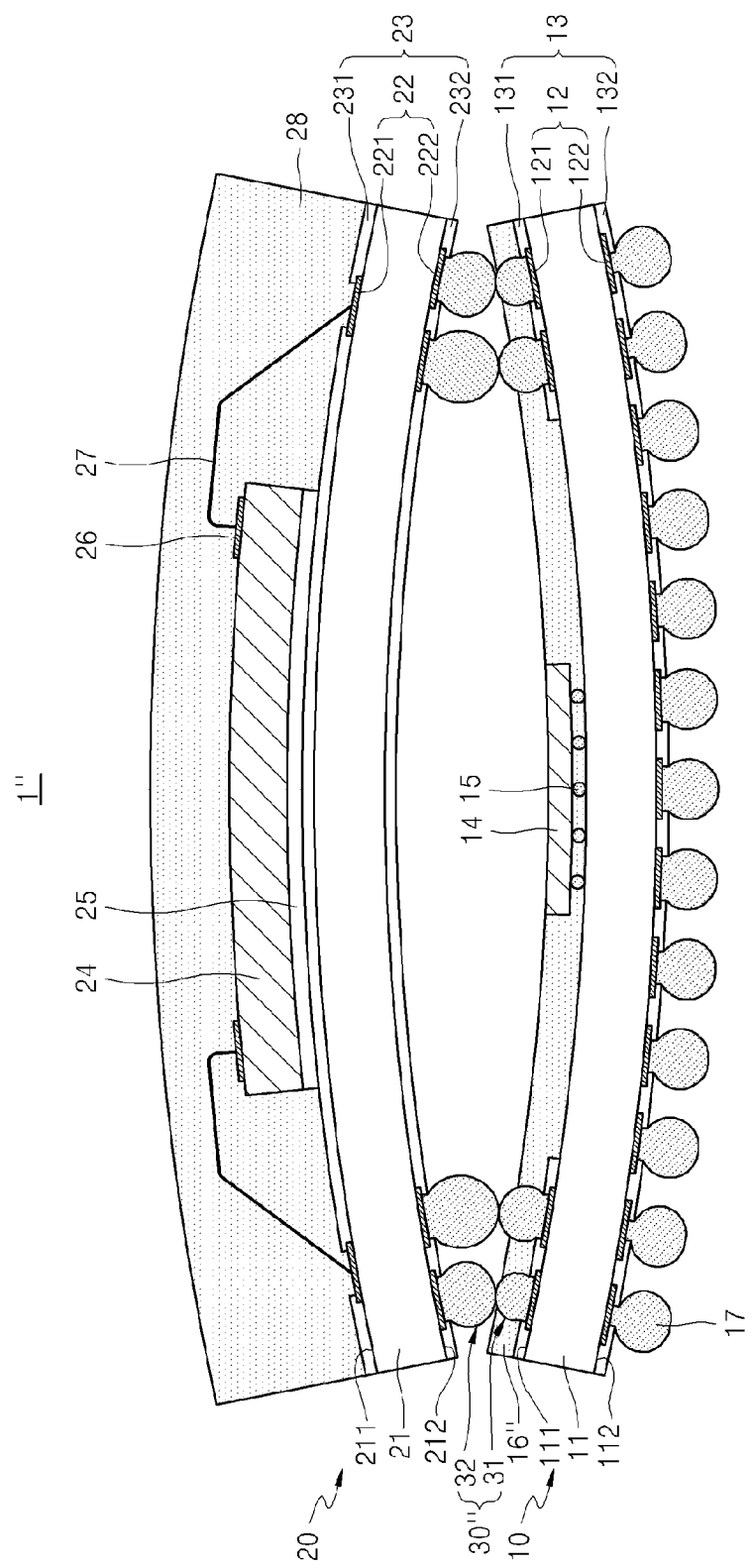
FIG. 18 is a cross-sectional view of the embodiment of the stacked semiconductor package 1 of FIG. 17 as taken along lines II-II' of FIGS. 3 and 4.
Figure 19:
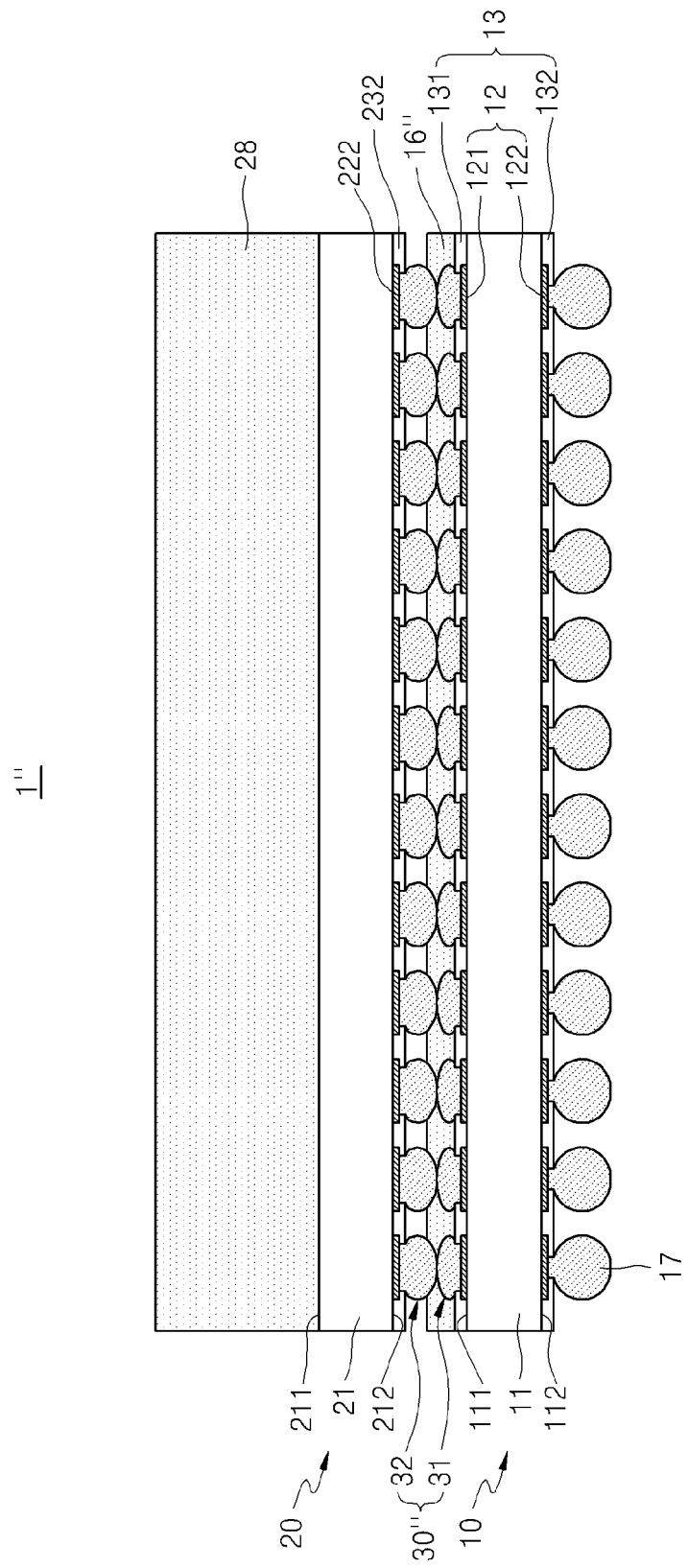
FIG. 19 is a cross-sectional view of the embodiment of the stacked semiconductor package 1 of FIG. 17 as taken along lines III-III' of FIGS. 3 and 4.
Figure 20:
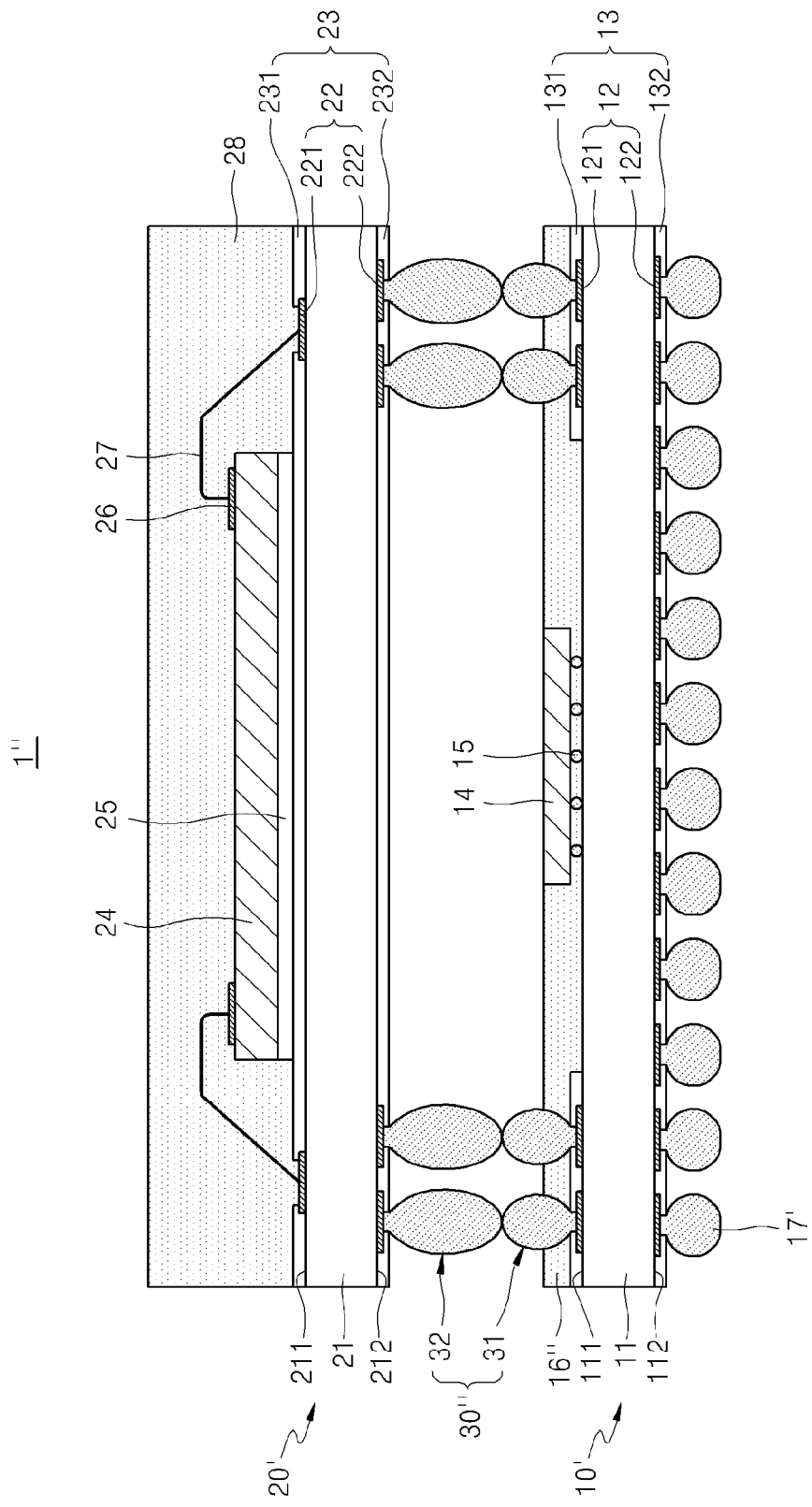
FIG. 20 is a cross-sectional view of the embodiment of the stacked semiconductor package 1 of FIG. 17 as taken along lines IV-IV' of the lower semiconductor package of FIG. 3 and the upper semiconductor package of FIG. 4.

FIGS. 18-20 are sectional views of the stacked semiconductor package 1" taken along lines II-II', III-III' and IV' of FIGS. 3 and 4. Because the aspects/features shown in these figures are similar to those described in the corresponding sectional views of FIGS. 10-12 and thus evident from the descriptions of FIGS. 10-12, such aspects/features of this embodiment of the stacked semiconductor package 1" will not be described in further detail.

In another embodiment of a stacked semiconductor package according to the inventive concept, the lower semiconductor package 10 and the upper semiconductor package 20 may each comprise a NSMD-type interconnection substrate, and connections similar to the connections 30" shown in FIGS. 17-20. Thus, in this case, the sizes of the first electrode pads of the lower semiconductor package 10 differ from each other as exemplified by the relative sizes of the first electrode pads 121a, 121b, 121c, 121d, and 121e illustrated in FIG. 3. Likewise, the sizes of the second electrode pads of the upper semiconductor package 20 differ from each other as exemplified by the relative sizes of the second electrode pads 222a, 222b, 222c, 222d, and 222e illustrated in FIG. 4.

In each of the embodiments and examples thereof described above, a stacked semiconductor package has a concave lower semiconductor package and a convex upper semiconductor package formed by the reflow soldering process used to form connections electrically connecting the packages. However, a stacked semiconductor package according to the inventive concept may be embodied as having a concave upper semiconductor package. In this embodiment, the heights of the connections disposed along each longer side of the lower package substrate, corresponding to an outer region 111b_L in FIG. 3, increases from a central to outside regions of the longer side of the lower package substrate. The varying heights of the connections may be produced in any manner heretofore described, e.g., through the use of (first and/or second) electrode pads of different sizes or different volumes of solder provided between the first electrode pads and the second electrode pads.

Figure 21:
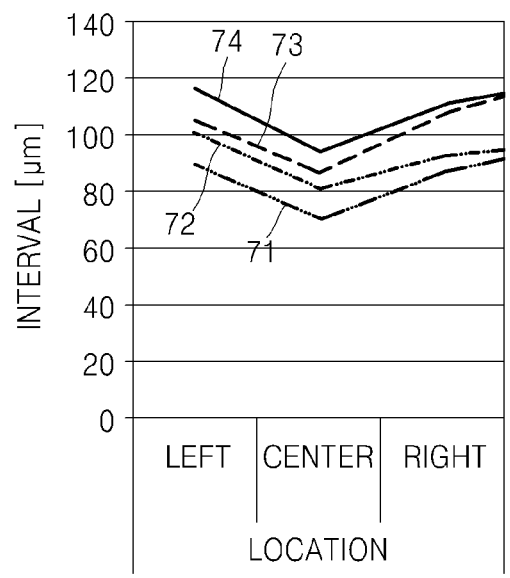
FIG. 21 is a graph of intervals between a lower semiconductor package and a mother board of semiconductor device, according to the inventive concept, as taken along a line corresponding to line I-I' of FIG. 3.

FIG. 21 is a graph of the intervals between the lower semiconductor package 10 of the stacked package and a mother board in a space aligned with the section taken along line I-I' of FIG. 3, due to warpage in the lower semiconductor package 10 and the mother board during the reflow soldering process.

In the graph of FIG. 21, a point along the X axis represents the location along the space between the lower semiconductor package 10 and the mother board at which the interval is measured, and a point along the Y axis represents the interval between the lower semiconductor package and the mother board in units of μm. In this regard, the 'left' part of the X axis of FIG. 21 corresponds to the first and second regions A and B in FIG. 3, the 'center' corresponds to the third region C in FIG. 3, and the 'right' corresponds to the fourth and fifth regions D and E in FIG. 3. That is, the X-axis corresponds to the longer side of the outer region of the stacked semiconductor package.

Also, in FIG. 21, the plot '71' indicates the intervals between the lower semiconductor package 10 and the mother board according to the inventive concept, whereas the plots '72', '73', and '74' indicate the intervals in other examples of a stacked semiconductor package on a mother board.

As plot '71' shows, the interval between the lower semiconductor package 10 and the mother board is about 70 μm in the 'center', about 110 μm in the 'left', and about 40 μm in the 'right'.

Figure 22:
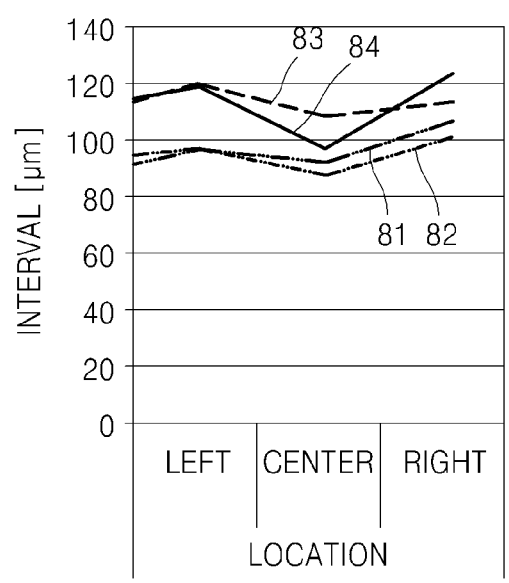
FIG. 22 is a graph of intervals between a lower semiconductor package and a mother board of semiconductor device, according to the inventive concept, as taken along a line corresponding to line III-III' of FIG. 3.

FIG. 22 is a graph of the intervals between the lower semiconductor package 10 and a mother board in a space aligned with the section take along line III-III' of FIG. 3, due to warpage in the lower semiconductor package 10 and the mother board during a reflow soldering process.

In the graph of FIG. 22, a point along the X axis represents the location along the space between the lower semiconductor package and the mother board at which the interval is measured, and a point along the Y axis represents the interval in units of μm between the lower semiconductor package and the mother board. In this regard, the 'left' part of the X axis corresponds to a region adjacent the letter III in FIG. 3, the 'right' corresponds to a region adjacent to the letter III' in FIG. 3, and the 'center' corresponds to a region therebetween. That is, the X axis corresponds to the shorter side of the outer region of the stacked semiconductor package.

Also, in FIG. 22, the plot '81' indicates the intervals between the lower semiconductor package 10 and the mother board according to the inventive concept, whereas the plots '82', '83' and '84' indicate the intervals in other examples of such a device.

As the plot '81' shows, the interval between the lower semiconductor package 10 and the mother board at the 'center' is about 90 μm, which is very similar to the interval between the lower semiconductor package 10 and the upper semiconductor package 20 at the 'right'. Also, as the plot '63' shows, the interval between the lower semiconductor package 10 and the upper semiconductor package 20 at the 'center' is about 25 μm, which is very similar to the interval between the lower semiconductor package 10 and the upper semiconductor package 20 at the 'left'.

As the plots '81' through '84' each show, the interval between the lower semiconductor package and the mother board at the 'center' is small, and the intervals between the lower semiconductor package and the mother board at the 'left' and 'right' are relatively large. However, compared to the results from the graph of FIG. 21, the warpage is relatively small. For example, as plot '81' shows, the interval between the lower semiconductor package and the mother board at the 'center' range is about 90 μm, and the interval between the lower semiconductor package and the mother board at the 'left' is about 95 μm. That is, the difference in the intervals at the 'center' and at the 'left' range is about 5 μm. Accordingly, the pair of opposite shorter sides of the lower semiconductor package 10 are hardly bent as compared to the pair of opposite longer sides.

Figure 23:
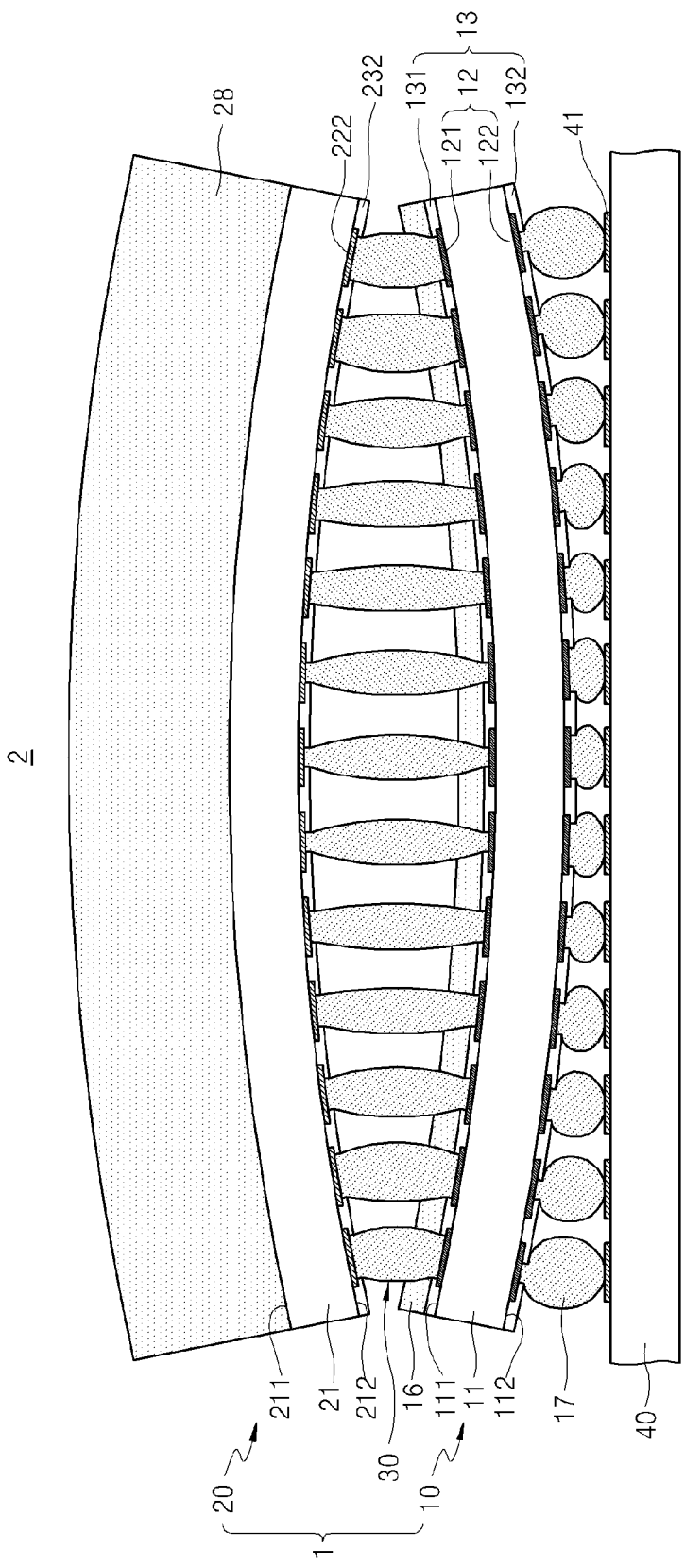
FIG. 23 is a cross-sectional view of an embodiment of a semiconductor device according to the inventive concept.

FIG. 23 is a cross-sectional view of a semiconductor device 2 comprising a stacked semiconductor package and a mother board, according to the inventive concept, take along one of the longer sides of the stacked semiconductor package as in the case of lines I-I' of FIGS. 3 and 4.

In the illustrated example of FIG. 23, the stacked semiconductor package of the semiconductor device 2 is similar to the stacked semiconductor package 1 of FIGS. 9-12. That is, the stacked semiconductor package 1 includes a lower semiconductor package 10, an upper semiconductor package 20, and connections 30.

As was described earlier, in the reflow soldering temperature range, the lower semiconductor package 10 may assume a downwardly convex shape. Thus, in this case, the intervals between the lower semiconductor package 10 and the mother board 40 in the semiconductor device 2 increase from central to outer (end) regions of the longer sides of the stacked semiconductor package 1. According to an aspect of the inventive concept, the external contact electrodes 17 are formed of different heights to compensate for the warpage of the lower semiconductor package 10.

In this device 2, second electrode pads 122 are disposed on the bottom surface 112 of the lower package substrate 11 of the lower semiconductor package 10, and the external contact electrodes 17 are disposed on the second electrode pads 122. Furthermore, the mother board 40 includes a board (of insulating material) and external contact terminals 41 disposed on a top surface of the board. The external contact electrodes 17 are respectively electrically connected to the external contact terminals 41. Accordingly, the lower semiconductor package 10 is mounted on the mother substrate 40 by means of the external contact terminals 41.

In this embodiment, the exposed areas of the tops of the second electrode pads 122 vary along each longer first side of the lower package substrate 11. In the illustrated example, the exposed areas of the second electrode pads 122 decrease from a central to outside regions of the longer first side of the lower package substrate 11. Thus, the heights of the external contact electrodes 17 formed after they are subjected to a reflow soldering process will increase from the central to the outer regions of the longer side of the stacked semiconductor package 1. Thus, the warpage of the lower semiconductor package as a result of the reflow soldering process is compensated for, and the external contact electrodes 17 adjacent to the center of the bottom surface 112 can be prevented from short-circuiting.

In this example, the sizes of the external contact terminals 41 are substantially the same. However, the sizes of the external contact terminals 41 may be determined based on the sizes of the top areas of the second electrode pads 122 exposed to the external contact electrodes. Thus, the sizes of the external contact terminals 41 may decrease from the central to the outer regions of the longer first side of the stacked semiconductor package 1.

In another embodiment, the volumes of the external contact electrodes 17 may vary. For example, the volumes of the external contact electrodes 17 increase from the central to the outside regions of the bottom surface 112 of the lower package substrate 11. In this way, the heights of the external contact electrodes 17 may vary, e.g. increase, from the central to the outside regions of the bottom surface 112 of the lower package substrate 11. Furthermore, in this case, the sizes of the exposed top areas of the second electrode pads 122 and/or of the external contact terminals 41 may be substantially the same. Also, the sizes of the exposed top areas of the second electrode pads 122 and/or of the external contact terminals 41 may decrease from the central to the outer regions of the longer side of the stacked semiconductor package 1.

Figure 24:
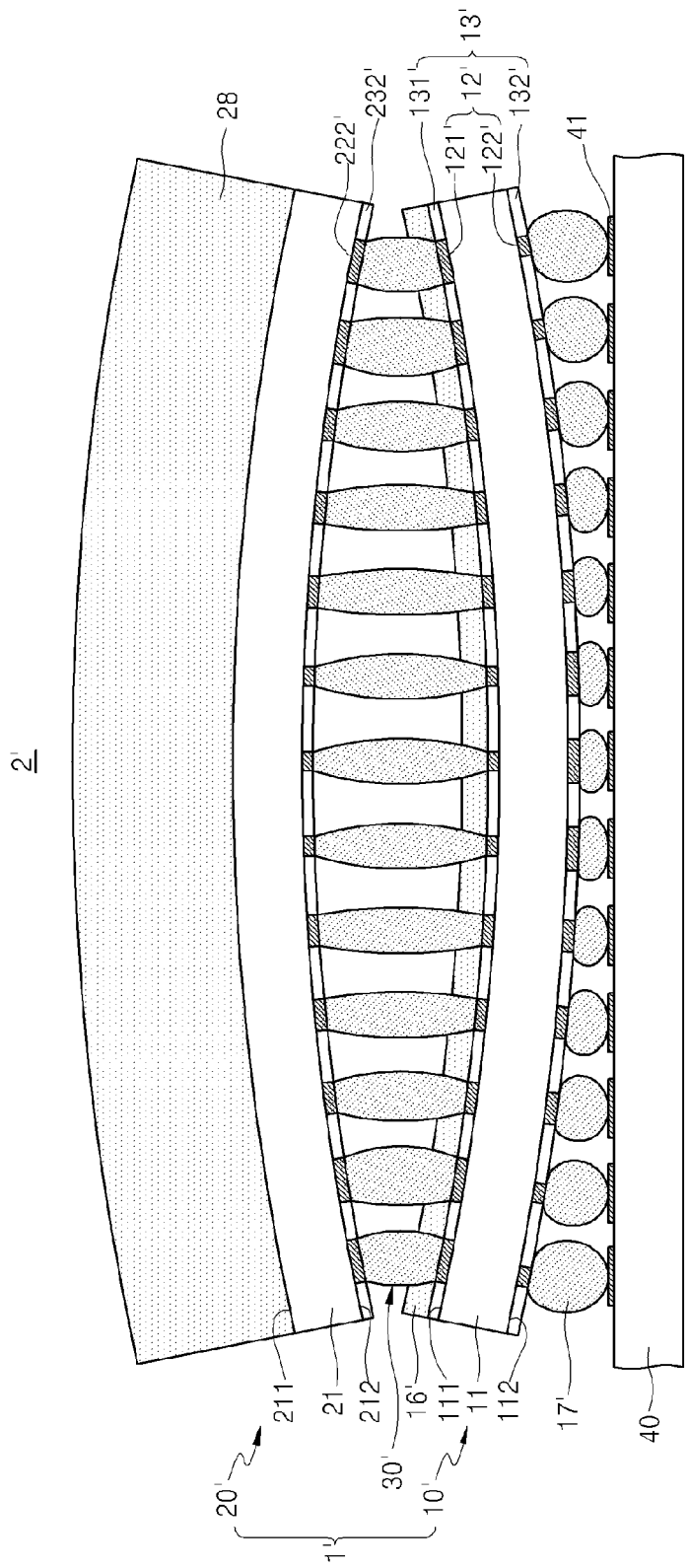
FIG. 24 is a cross-sectional view of another embodiment of a semiconductor device according to the inventive concept.

FIG. 24 is a cross-sectional view of another embodiment of a semiconductor device comprising a stacked semiconductor package and a mother board, according to the inventive concept, take along one of the longer sides of the stacked semiconductor package as in the case of lines I-I' of FIGS. 3 and 4.

In the illustrated example of FIG. 24, the stacked semiconductor package of the semiconductor device 2' is similar to the stacked semiconductor package 1' of FIGS. 13-16. That is, the stacked semiconductor package 1' a lower semiconductor package 10', an upper semiconductor package 20', and connections 30'.

In this embodiment as well, according to an aspect of the inventive concept, the external contact electrodes 17' are formed of different heights, using the same mechanism described above, to compensate for the warpage of the lower semiconductor package 10.

Because the other features and aspects and advantages of the embodiment of FIG. 24 are apparent from the descriptions of the embodiments of FIGS. 13-16 and 23 above, such features and aspects will not be described in further detail. Also, it will be apparent that all of the variations described with respect to the embodiments of FIGS. 13-16 and FIG. 23, including those associated with the relative sizes of the external contact terminals 41, the relative sizes of the exposed top areas of the second electrode pads 122, and the volumes of the external contact electrodes 17', may be applied to this embodiment of FIG. 24 as well.

Figure 25:
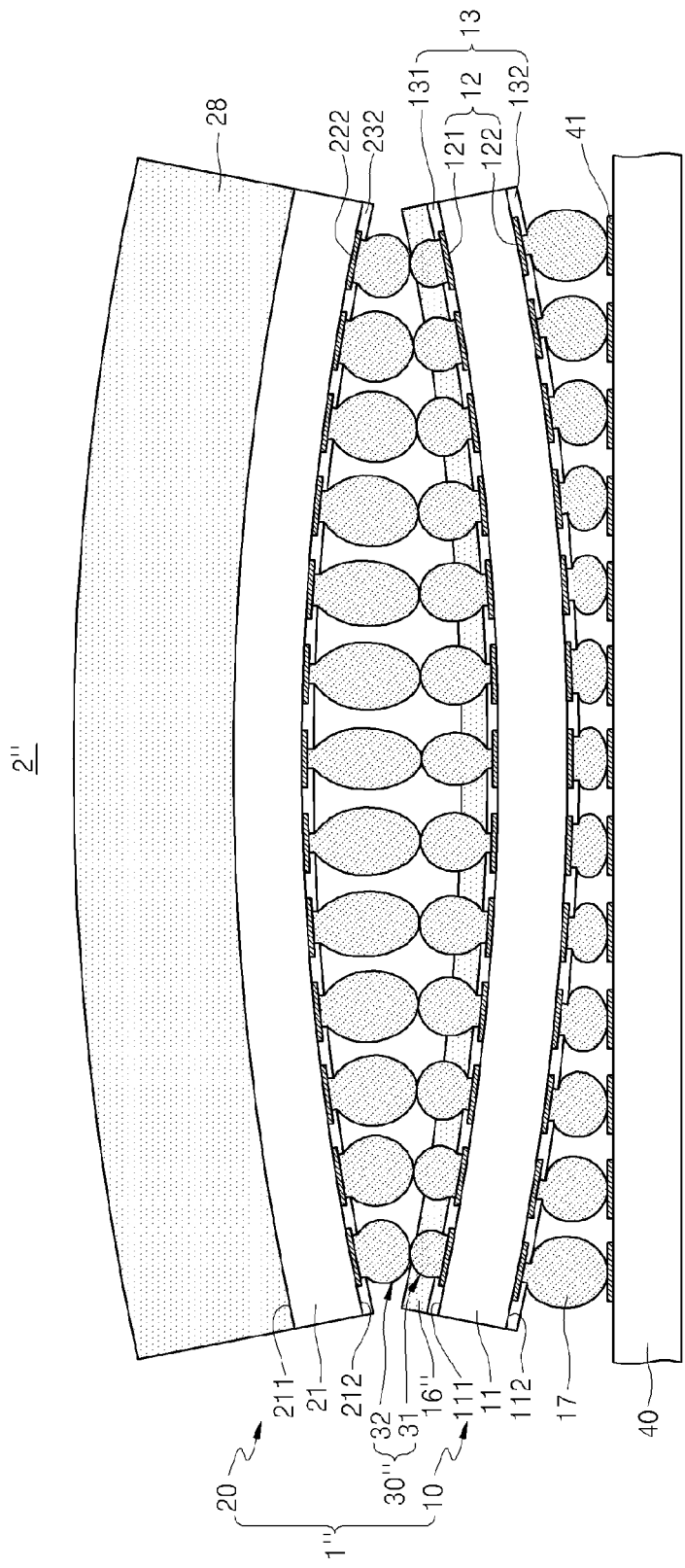
FIG. 25 is a cross-sectional view of still another embodiment of a semiconductor device according to the inventive concept.

FIG. 25 is a cross-sectional view of still another embodiment of a semiconductor device comprising a stacked semiconductor package and a mother board, according to the inventive concept, take along one of the longer sides of the stacked semiconductor package as in the case of lines I-I' of FIGS. 3 and 4.

In the illustrated example of FIG. 25, the stacked semiconductor package of the semiconductor device 2" is similar to the stacked semiconductor package 1" of FIGS. 17-20. That is, the stacked semiconductor package 1" includes a lower semiconductor package 10, the upper semiconductor package 20, and the connections 30".

Because the other features and aspects and advantages of the embodiment of FIG. 25 are apparent from the descriptions of the embodiments of FIGS. 17-20 and 23 above, such features and aspects will not be described in further detail. Also, it will be apparent that all of the variations described with respect to the embodiments of FIGS. 17-20 and FIG. 23, including those associated with the relative sizes of the external contact terminals 41, the relative sizes of the exposed top areas of the second electrode pads 122, and the volumes of the external contact electrodes 17', may be applied to this embodiment of FIG. 25 as well.

Figure 26:
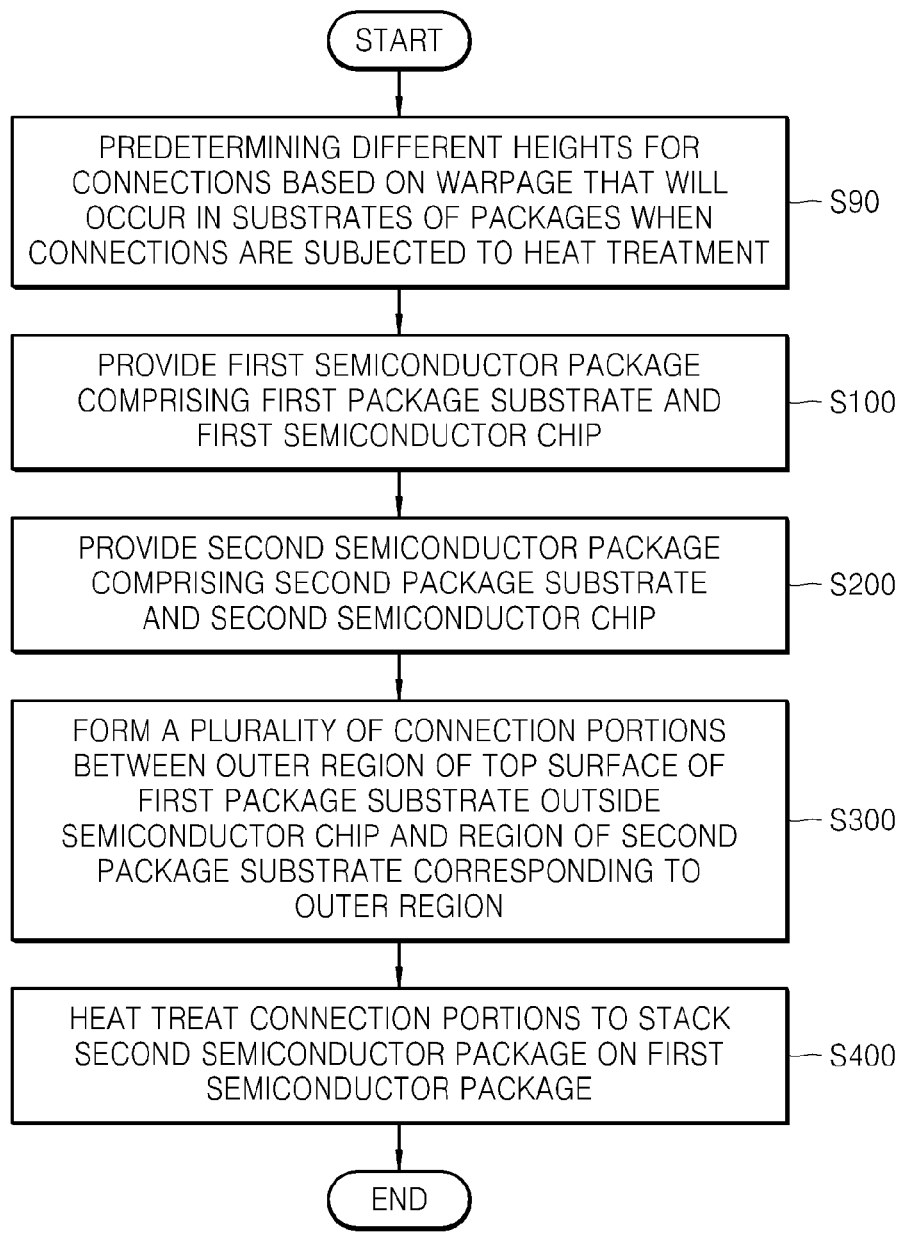
FIG. 26 is a flowchart of a method of fabricating a stacked semiconductor package, according to the inventive concept.

FIG. 26 is a flowchart illustrating a method of fabricating a stacked semiconductor package, according to the inventive concept. The method may be used to fabricate any of the stacked semiconductor packages illustrated in and/or described with respect to FIGS. 1 and 3 to 20.

Referring to FIG. 26, in operation S90, different heights for the connections are determined based on the warpage that will occur in the substrates of the packages are subject to a heat treatment (e.g., a soldering reflow process).

In operation S100, a first semiconductor package including a first package substrate and a first semiconductor chip mounted on the first package substrate is provided. The first package substrate includes a top surface and a bottom surface, and the first semiconductor chip may be mounted on a central region of the top surface of the first package substrate. The first semiconductor package may include two or more semiconductor chips stacked on each other.

In operation S200, a second semiconductor package including a second package substrate and a second semiconductor chip mounted on the second package substrate is provided. The second package substrate includes a top surface and a bottom surface, and the second semiconductor chip is mounted on a central region of the top surface of the second package substrate. In this regard, the second semiconductor chip is larger than the first semiconductor chip. Also, the second semiconductor package may include two or more semiconductor chips stacked on each other.

In operation S300, material constituting the connections, e.g., a plurality of bodies of solder, is provided between an outer region of the top surface of the first package substrate outside the first semiconductor chip and a region of the bottom surface of the second package substrate corresponding to the outer region. This can be accomplished, for example, as the result of stacking the second semiconductor package on the first semiconductor package with the solder bodies provided on the second package substrate (in the case of fabricating the embodiments of FIGS. 9-16) or by stacking one package on the other with the solder bodies provided on the first and second packages substrates (in the case of fabricating the embodiment of FIGS. 17-20). In the case of fabricating the embodiment of FIGS. 17-20, a conductive interposer may be provided between respective sets of solder bodies.

In any case, the material constituting the connections, namely, the solder bodies in this example, is formed along opposite first longer sides and opposite second shorter sides of the stacked first and second packages.

In operation S400, a heat treatment (e.g., reflow soldering process) is performed on the material (solder bodies), thereby forming the connections which connect the first and second semiconductor packages to one another. As a result of the reflow soldering process and of means taken in providing the substrate packages and the solder bodies (namely appropriate selection of the size of conductive pads or at least of the size of exposed areas of top surfaces of conductive pads on which the solder bodies are provided, as well as appropriate selection of volumes of the solder bodies), the heights of the connections disposed along each first side of the stacked packages substrate vary from a central to outer regions of the first side. For example, the heights of the connections gradually decrease from the central to the outer regions. On the other hand, the heights of connections disposed along each second side may be substantially the same.

Figure 27:
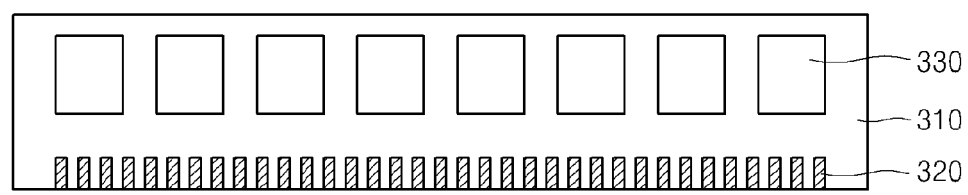
FIG. 27 is a schematic view of an example of a semiconductor module including a stacked semiconductor package, according to the inventive concept.

FIG. 27 shows an example of a semiconductor module employing a stacked semiconductor package, according to the inventive concept.

Referring to FIG. 27, this example of semiconductor module 3A includes a module board 310, a plurality of contact terminals 320, and a plurality of stacked semiconductor packages 330. The module board 310 may be a printed circuit board. The stacked semiconductor packages 330 are mounted on the module board 310, and at least one of the stacked semiconductor packages 330 is a stacked semiconductor package according to the inventive concept (e.g., any of the packages 1, 1', and 1" illustrated in FIGS. 9 through 20. The contact terminals 320 are formed at a side of the module board 310, and are electrically connected to the stacked semiconductor packages 330.

Figure 28:
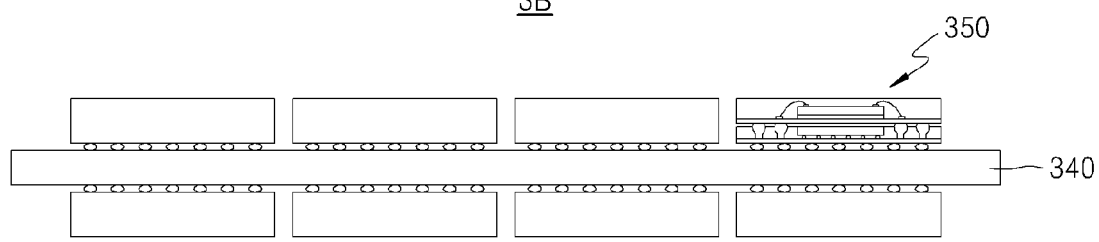
FIG. 28 is a schematic view of another example of a semiconductor module including a stacked semiconductor package, according to the inventive concept.

FIG. 28 shows another example of a semiconductor module employing a stacked semiconductor package, according to the inventive concept.

Referring to FIG. 28, this example of a semiconductor module 3B includes a module board 340 and a plurality of stacked semiconductor packages 350 mounted on the module board 340. The module board 340 may be a printed circuit board, and at least one of the stacked semiconductor packages 330 is a stacked semiconductor package according to the inventive concept (e.g., any of the packages 1, 1', and 1" illustrated in FIGS. 9 through 20.

Figure 29:
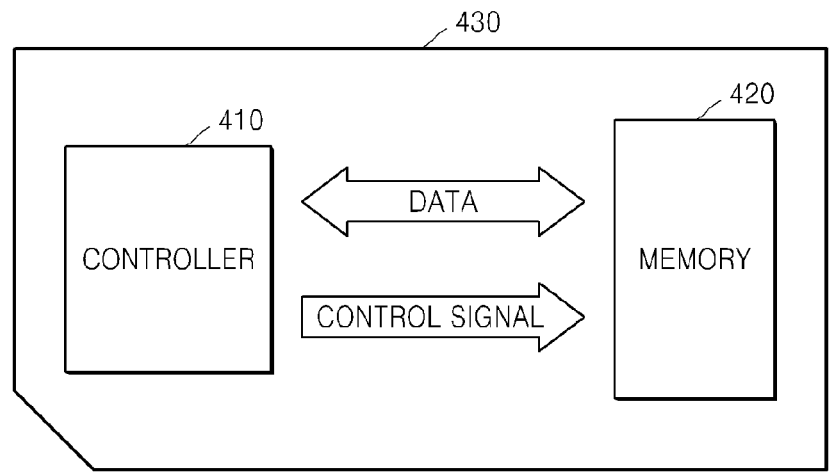
FIG. 29 is a schematic view of an example of a memory card employing a stacked semiconductor package, according to the inventive concept.

FIG. 29 shows an example of a memory card employing a stacked semiconductor package, according to the inventive concept. The memory card 4 may be used by various portable devices to store date. For example, the memory card 4 may be a multi media card (MMC) or a secure digital (SD) card.

Referring to FIG. 29, the memory card 4 of this example includes a controller 410, a memory 420, and a housing 430 containing the controller 410 and the memory 420. The controller 410 and the memory 420 are operatively connected to exchange electrical signals with each other. For example, according to a command of the controller 410, the memory 420 and the controller 410 exchange data with each other. As such, the memory card 400 may store data in the memory 420 or may output data from the memory 420 to the outside.

The memory 420 includes at least one stacked semiconductor package or semiconductor device including a stacked semiconductor package, according to the inventive concept.

Figure 30:
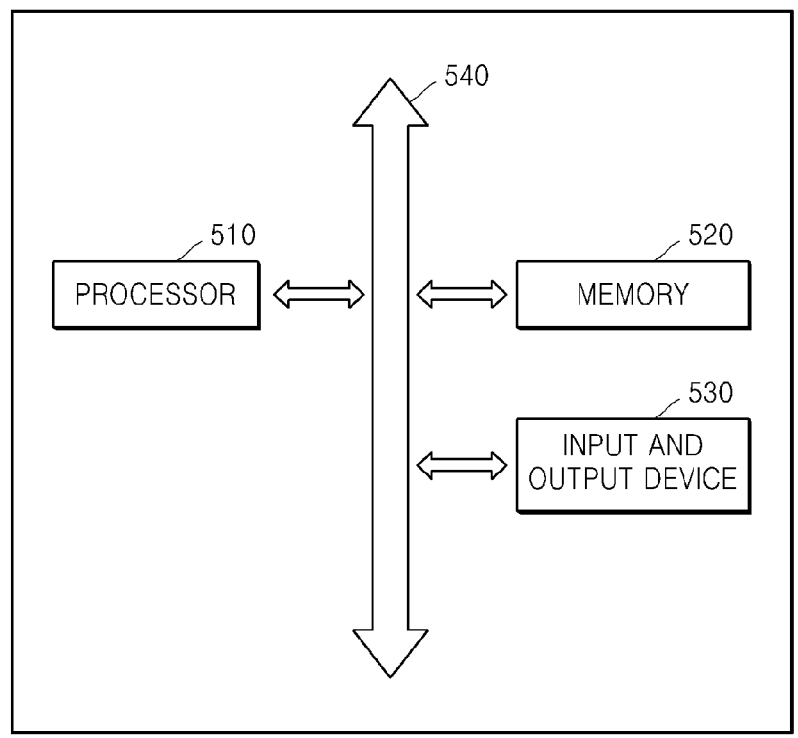
FIG. 30 is a schematic view of an example of an electronic system employing a stacked semiconductor package, according to the inventive concept.

FIG. 30 shows an example of an electronic system 5 employing a stacked semiconductor package, according to the inventive concept. The electronic system 5 may be used in, for example, a mobile phone, an MP3 player, a navigation device, a solid state drive (SSD), or household appliances.

Referring to FIG. 30, the electronic system 500 of this example includes a processor 510, a memory unit 520, and an input/output device 530, and a bus 540. The processor 510, the memory unit 520, and the input/output device 530 data-communicate with each other through the bus 540. The processor 510 executes a program and controls the electronic system 500. The input/output device 530 may input or output data of the electronic system 500. The electronic system 500 may be connected to an external device, such as a personal computer or a network, through the input/output device 530 so as to exchange data—with the external device. The memory unit 520 may store code and data for operating the processor 510 and includes at least one stacked semiconductor package or semiconductor device including a stacked semiconductor package, according to the inventive concept.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A stacked semiconductor package comprising:
    a first semiconductor package including a first package substrate and a first semiconductor chip mounted on the first package substrate, the first package substrate having a first side constituting an outer peripheral region thereof, wherein the first semiconductor chip is surrounded by a mold except for a top surface of the first semiconductor chip,
    a second semiconductor package including a second package substrate and a second semiconductor chip mounted on the second package substrate; and
    a plurality of connections electrically connecting the first semiconductor package and the second semiconductor package, the connections being disposed outside the first semiconductor chip along the outer peripheral region of the first package substrate, and
    wherein a first group of the connections is disposed along the first side of the first package substrate as spaced from one another, and the heights of the connections of the first group vary from a central to an outer region of the first side.

2. The stacked semiconductor package of claim 1, wherein a second group of the connections is disposed along a second side of the first package substrate as spaced from one another, and the heights of the connections of the second group are substantially the same.

3. The stacked semiconductor package of claim 2, wherein the first semiconductor package further includes a plurality of first electrode pads disposed on a top surface of the first package substrate and respectively electrically connected to the connections, and the second semiconductor package further includes a plurality of second electrode pads disposed on a bottom surface of the second package substrate and respectively electrically connected to the connections.

4. The stacked semiconductor package of claim 3, wherein the areas of the first electrode pads exposed to the connections vary from a central to an outer region of the first side.

5. The stacked semiconductor package of claim 3, wherein the areas of the first electrode pads exposed to the connections are substantially the same along the second side.

6. The stacked semiconductor package of claim 3, wherein the connections each comprise:

a plurality of first contact electrodes respectively disposed on the first electrode pads; and a plurality of second contact electrodes respectively disposed on the second electrode pads and respectively electrically connected to the first contact electrodes.

7. The stacked semiconductor package of claim 1, wherein the heights of the connections of the first group decrease from the central to the outer region of the first side.

8. The stacked semiconductor package of claim 1, wherein the connections are disposed in two or more rows along the outer peripheral region of the first package substrate.

9. A stacked semiconductor package comprising:

a first semiconductor package including a first package substrate and a first semiconductor chip mounted on the first package substrate, the first package substrate having a first side constituting an outer peripheral region thereof, wherein a plurality of first electrode pads are disposed on a top surface of the first package substrate as spaced from one another along the outer peripheral region of the first package substrate, a distance between two adjacent first electrode pads changes as the two adjacent first electrode pads are closer to a central region of the first side;

a second semiconductor package including a second package substrate and a second semiconductor chip mounted on the second package substrate; and a plurality of connections electrically connecting the first semiconductor package and the second semiconductor package, the connections being respectively disposed on the first electrode pads.

10. The stacked semiconductor package of claim 9, wherein a first group of the connections is disposed on the first electrode pads along the first side.

11. The stacked semiconductor package of claim 10, wherein the first package substrate has a second side constituting the outer peripheral region thereof, the distances between two adjacent second electrode pads are substantially the same along the second side.

12. The stacked semiconductor package of claim 11, wherein a second group of the connections is disposed on the first electrode pads along the second side.

13. The stacked semiconductor package of claim 12, wherein the heights of the connections of the first group vary from a central to an outer region of the first side and the heights of the connections of the second group are substantially the same along the second side.

14. The stacked semiconductor package of claim 9, wherein the distance between two adjacent first electrode pads increases as the two adjacent first electrode pads are closer to the central region of the first side.

15. The stacked semiconductor package of claim 9, wherein a plurality of second electrode pads are disposed on a bottom surface of the second package substrate and respectively electrically connected to the connections.

16. The stacked semiconductor package of claim 15, wherein the connections each comprise:

a plurality of first contact electrodes respectively disposed on the first electrode pads; and a plurality of second contact electrodes respectively disposed on the second electrode pads and respectively electrically connected to the first contact electrodes.

17. The stacked semiconductor package of claim 9, wherein the areas of the first electrode pads exposed to the connections vary from a central to an outer region of the first side.

18. The stacked semiconductor package of claim 11, wherein the areas of the first electrode pads exposed to the connections are substantially the same along the second side.

19. The stacked semiconductor package of claim 9, wherein the first electrode pads are disposed in two or more rows along the outer peripheral region of the first package substrate.

* * * * *